US010257970B2

(12) United States Patent
Ohyama et al.

(10) Patent No.: US 10,257,970 B2
(45) Date of Patent: Apr. 9, 2019

(54) FEEDER FOR AN ELECTRONIC COMPONENT

(71) Applicant: YAMAHA HATSUDOKI KABUSHIKI KAISHA, Shizuoka-ken (JP)

(72) Inventors: Kazuyoshi Ohyama, Kumagaya (JP); Tsutomu Yanagida, Kumagaya (JP); Yoshinori Kano, Kumagaya (JP); Yuuki Tomita, Kumagaya (JP); Yutaka Chida, Kumagaya (JP)

(73) Assignee: YAMAHA HATSUDOKI KABUSHIKI KAISHA, Shizuoka-ken (JP)

( * ) Notice: Subject to any disclaimer, the term of this patent is extended or adjusted under 35 U.S.C. 154(b) by 0 days.

(21) Appl. No.: 15/728,025

(22) Filed: Oct. 9, 2017

(65) Prior Publication Data

US 2018/0042152 A1   Feb. 8, 2018

Related U.S. Application Data

(60) Division of application No. 14/582,892, filed on Dec. 24, 2014, now Pat. No. 9,820,420, which is a
(Continued)

(30) Foreign Application Priority Data

Jun. 29, 2012   (JP) .................................. 2012-147126
Jun. 29, 2012   (JP) .................................. 2012-147307

(51) Int. Cl.
  *H05K 13/04*   (2006.01)
(52) U.S. Cl.
  CPC ..... *H05K 13/0417* (2013.01); *H05K 13/0419* (2018.08)

(58) Field of Classification Search
  CPC ....... B23P 19/00; B23P 19/001; B23P 19/002; H05K 13/0417; H05K 13/0419
  See application file for complete search history.

(56) References Cited

U.S. PATENT DOCUMENTS

| 6,032,845 A | 3/2000 | Piccone et al. |
| 6,269,860 B1 | 8/2001 | Ishikawa et al. |
| (Continued) | | |

FOREIGN PATENT DOCUMENTS

| CN | 1802087 A | 7/2006 |
| JP | 2000-209000 A | 7/2000 |
| (Continued) | | |

OTHER PUBLICATIONS

JP Office Action dated Dec. 12, 2017, from corresponding JP Appl No. 2016-208074, with English translation, 6 pp.
(Continued)

*Primary Examiner* — Carl J Arbes
(74) *Attorney, Agent, or Firm* — Studebaker & Brackett PC

(57) ABSTRACT

A feeder and a feeder control method, as well as an electronic component device, reliably engaging a supply tape in a loading operation even if there is an accumulated pitch error between sprocket holes. Third, second and first sprockets are arranged successively from an insertion port. The sprocket hole on a forward end portion of the inserted supply tape is fitted with a third tooth of the third sprocket in the loading operation. The supply tape is rotated by rotation of the third sprocket until fitting with a second tooth of the second sprocket, and the rotation of the third sprocket is stopped after the second tooth fits with the sprocket hole on the forward end portion.

14 Claims, 16 Drawing Sheets

Related U.S. Application Data continuation of application No. PCT/JP2013/067142, filed on Jun. 21, 2013.

(56) References Cited

U.S. PATENT DOCUMENTS

| | | | |
|---|---|---|---|
| 7,220,095 | B2 | 5/2007 | Lyndaker et al. |
| 7,472,737 | B1 | 1/2009 | Rachkov |
| 7,866,518 | B2 | 1/2011 | Wada |
| 8,264,787 | B2 * | 9/2012 | Huang .............. H02K 41/0356 310/12.16 |
| 2003/0219330 | A1 | 11/2003 | Lyndaker et al. |
| 2005/0160593 | A1 | 7/2005 | Yamamura et al. |
| 2008/0093375 | A1 | 4/2008 | Davis et al. |
| 2011/0072654 | A1 * | 3/2011 | Oyama .............. H05K 13/0417 29/832 |
| 2011/0243695 | A1 | 10/2011 | Hwang et al. |
| 2011/0287010 | A1 | 11/2011 | Assinder et al. |

FOREIGN PATENT DOCUMENTS

| | | | |
|---|---|---|---|
| JP | 2004-111797 | A | 4/2004 |
| JP | 2004-342699 | A | 12/2004 |
| JP | 2005-539370 | A | 12/2005 |
| JP | 2007-214476 | A | 8/2007 |
| JP | 2007-234712 | A | 9/2007 |
| JP | 2009-539370 | A | 11/2009 |
| JP | 2010-507908 | A | 3/2010 |
| JP | 2010-245385 | A | 10/2010 |
| JP | 2011-077096 | A | 4/2011 |
| JP | 2011-171664 | A | 9/2011 |
| JP | 2011-181816 | A | 9/2011 |
| JP | 2011-211169 | A | 10/2011 |
| JP | 2014-011328 | A | 1/2014 |

OTHER PUBLICATIONS

An Office Action mailed by the Japanese Patent Office dated Sep. 11, 2018, which corresponds to Japanese Patent Application No. 2017-242596 and is related to U.S. Appl. No. 15/728,025.

An Office Action issued by the Japanese Patent Office dated Jun. 6, 2017, which corresponds to Japanese Patent Application No. 2016-152007 and is related to U.S. Appl. No. 14/582,892.

An Office Action issued by the Japanese Patent Office dated Jul. 18, 2017, which corresponds to Japanese Patent Application No. 2016-208074 and is related to U.S. Appl. No. 14/582,892.

An Office Action issued by the Chinese Patent Office dated Nov. 21, 2016, which corresponds to Chinese Patent Application No. 201380034739.8 and is related to U.S. Appl. No. 14/582,892.

An Office Action; "Notification of Reasons for Refusal" issued by the Japanese Patent Office dated May 10, 2016, which corresponds to Japanese Patent Application No. 2012-147126 and is related to U.S. Appl. No. 14/582,892.

The extended European search report issued by the European Patent Office dated Feb. 1, 2016, which corresponds to European Patent Application No. 13808891.9-1905 and is related to U.S. Appl. No. 14/582,892.

An Office Action issued by the Korean Patent Office dated Jan. 8, 2016, which corresponds to Korean Patent Application No. 10-2015-7001865 and is related to U.S. Appl. No. 14/582,892.

International Search Report; PCT/JP2013/067142; dated Sep. 3, 2013.

Communication pursuant to Article 94(3) EPC issued by the European Patent Office dated Jul. 19, 2018, which corresponds to European Patent Application No. 13 808 891.9-1207 and is related to U.S. Appl. No. 15/728,025.

An Office Action mailed by the Japanese Patent Office dated Jan. 29, 2019, which corresponds to Japanese Patent Application No. 2018-038307 and is related to U.S. Appl. No. 15/728,025.

* cited by examiner

FEEDER FOR AN ELECTRONIC COMPONENT

CROSS-REFERENCE TO RELATED APPLICATIONS

This is a Divisional Application of U.S. application Ser. No. 14/582,892 filed on Dec. 24, 2014, and claims benefit of priority to Japanese Patent Application No. 2012-147126 filed on Jun. 29, 2012, to Japanese Patent Application No. 2012-147307 filed on Jun. 29, 2012, and to International Patent Application No. PCT/JP2013/067142 filed on Jun. 21, 2013, the entire content of each of which is incorporated herein by reference.

TECHNICAL FIELD

The present technical field relates to a feeder and a feeder control method as well as an electronic component mounting device, and more particularly, it relates to an electronic component mounting device capable of reliably supplying electronic components and having high operability.

BACKGROUND

In recent years, workability improvement of an electronic component mounting device has been awaited in an operation of mounting electronic components on printed boards and producing circuit boards. For that purpose, it is important to reliably supply the electronic components and to complete a replenishing time for the electronic components or stage exchange in a short time.

As prior art, a device inserting a supply tape in which electronic components are stored, driving and inserting a third sprocket engaging with sprocket holes possessed by the inserted supply tape and controlling a cut sprocket hole of the supply tape, having the cut sprocket hole cut to be shorter than a half-moon state on a forward end portion, inserted from an insertion port to a position engaging with a driving sprocket when driving the driving sprocket engaging with the sprocket holes and moving the electronic components to an extraction position for performing cuing is described in Japanese Patent Laying-Open No. 2011-181816.

Japanese Patent Laying-Open No. 2011-181816 creates the cut sprocket hole cut to be shorter than the half-moon state on the forward end portion of the supply tape, controls the cut sprocket hole to the position engaging with the driving sprocket in a case where the supply tape is inserted from the insertion port, and performs cuing when newly setting a tape on a feeder.

In Japanese Patent Laying-Open No. 2011-181816, however, there is an accumulated pitch error while the sprocket holes of the supply tape for positioning are provided at prescribed intervals, and the accumulated pitch error enlarges at an interval between sprocket holes on separated positions, also in a series of supply tapes. In general, the interval between a sprocket provided in the vicinity of a supply port in the feeder and a sprocket provided in the vicinity of an electronic component outlet port is about 400 mm, and a pitch error in the interval between sprocket holes separated from each other by 400 mm becomes larger than the interval between sprocket holes separated from each other by 100 mm in a supply tape provided with sprocket holes for positioning at a pitch of 4 mm, for example.

While it is necessary to reliably engage the sprocket driving the supply tape and the sprocket holes of the supply tape in order to reliably move the electronic components stored in the supply tape to the outlet port, a countermeasure as to such an accumulated pitch error between the sprocket holes is not disclosed in Japanese Patent Laying-Open No. 2011-181816.

SUMMARY

In consideration of the aforementioned problem, an object of the present disclosure is to provide a feeder and a feeder control method as well as an electronic component mounting device each having high reliability and capable of performing control or the like capable of reliably engaging a driving sprocket moving electronic components to an outlet port and sprocket holes of a supply tape with each other at the time of a loading operation newly inserting the supply tape into the feeder even if there is an accumulated pitch error between the sprocket holes.

In order to attain the aforementioned object, it is set as a first characteristic of the present disclosure that a feeder according to the present disclosure includes a tape chute guiding movement of a supply tape, a third sprocket having a third tooth fitting with a sprocket hole of the supply tape inserted into an insertion port and moving the supply tape on the tape chute by rotation, a second sprocket driving motor driving the third sprocket, a second sprocket provided in a downstream direction of the third sprocket, having a second tooth fitting with the sprocket hole of the supply tape fed by the third sprocket and moving the supply tape on the tape chute by rotation, an exposing mechanism provided in a downstream direction of the second sprocket for exposing an electronic component in a pocket covered by a cover tape of the supply tape fed by the second sprocket, a first sprocket provided in a downstream direction of the exposing mechanism, having a first tooth fitting with the sprocket hole of the supply tape and moving the supply tape storing the electronic component exposed by the exposing mechanism on the tape chute by rotation, a first sprocket driving motor synchronously driving the first sprocket and the second sprocket, and a control portion controlling the first sprocket driving motor and the second sprocket driving motor.

In the aforementioned feeder according to the first characteristic of the present disclosure, it is set as a second characteristic of the present disclosure that the control portion controls the second sprocket driving motor when the sprocket hole on a forward end of the supply tape fed by the third sprocket fits with the second tooth of the second sprocket to render the traveling speed of the supply tape resulting from the rotation of the third sprocket smaller than the traveling speed of the supply tape resulting from the rotation of the second sprocket.

In the aforementioned feeder according the first characteristic or the second characteristic of the present disclosure, it is set as a third characteristic of the present disclosure that the third sprocket has a one-way clutch, and is pulled by the supply tape moving faster than the traveling speed resulting from the rotation of the third sprocket by movement of the supply tape resulting from the rotation of the second sprocket to be rotatable in a forward direction.

In the aforementioned feeder according to any of the first characteristic to the third characteristic of the present disclosure, it is set as a fourth characteristic of the present disclosure that the exposing mechanism exposes the electronic component in the pocket of the supply tape by performing cut-open processing of the cover tape of the supply tape.

It is set as a fifth characteristic of the present disclosure that the aforementioned feeder according to any of the first characteristic to the fourth characteristic of the present disclosure arranges the interval between the first sprocket and the second sprocket to be closer than the interval between the second sprocket and the third sprocket.

It is set as a sixth characteristic of the present disclosure that the aforementioned feeder according to any of the first characteristic to the fifth characteristic of the present disclosure brings the shape of the third tooth into a round-tooth shape or a shape having a smaller number of catches than the second tooth.

In the aforementioned feeder according to the sixth characteristic of the present disclosure, it is set as a seventh characteristic of the present disclosure that the control portion controls the first sprocket driving motor and slows down/stops the rotation of the second sprocket in a case where a first detection sensor provided in the downstream direction of the second sprocket for sensing the presence or absence of the supply tape senses the forward end portion of the supply tape.

In the aforementioned feeder according to the seventh characteristic of the present disclosure, it is set as an eighth characteristic of the present disclosure that the control portion controls the first sprocket driving motor by a reverse rotation operation according to minimum pitch feeding up to a position where the first detection sensor does not sense the supply tape and rotates the second sprocket by the reverse rotation operation according to the minimum pitch feeding after slowdown/stoppage of the rotation of the second sprocket.

In the aforementioned feeder according to the eighth characteristic of the present disclosure, it is set as a ninth characteristic of the present disclosure that the control portion controls the second sprocket driving motor from the position where the first detection sensor does not sense the supply tape, rotates the second sprocket at a prescribed speed, moves the supply tape by a prescribed quantity, and high-speed-moves the forward end portion up to a position immediately before reaching a cutter blade of the exposing mechanism.

In the aforementioned feeder according to the ninth characteristic of the present disclosure, it is set as a tenth characteristic of the present disclosure that the control portion controls the second sprocket driving motor from the position immediately before reaching the cutter blade of the exposing mechanism, rotates the second sprocket at a prescribed ultralow speed and ultralow acceleration and moves the supply tape by the prescribed quantity.

In the aforementioned feeder according to the first characteristic or the second characteristic of the present disclosure, it is set as an eleventh characteristic of the present disclosure that the control portion moves the supply tape in a reverse direction by the prescribed quantity according to a previously set reverse feed rate when sensing that an instruction for starting an unloading operation has been issued from an operation panel transmitting an operation signal correspondingly to an operation of an operator and in a case where a second detection sensor provided in a downstream direction of the insertion port for sensing the presence or absence of the supply tape senses the presence of the supply tape.

It is set as a twelfth characteristic of the present disclosure that the aforementioned feeder according to the eleventh characteristic of the present disclosure is provided with a plurality of lanes through which a plurality of supply tapes are parallelly fed respectively and the operation panel transmitting the operation signal to the control portion correspondingly to the operation of the operator, and this operation panel has a selection button for selecting any of the lanes by the operation of the operator, a return button for moving the supply tape in the reverse direction by a second prescribed quantity, an unloading button for starting the unloading operation and two display portions 7-seg-displaying the operation of the operation panel.

In the aforementioned feeder according to the twelfth characteristic of the present disclosure, it is set as a thirteenth characteristic of the present disclosure that the control portion interrupts an operation of moving the supply tape in a reverse direction in a case of sensing that at least any one button of the operation panel has been pressed during the operation of moving the supply tape in the reverse direction.

In the aforementioned feeder according to the first characteristic or the second characteristic of the present disclosure, it is set as a fourteenth characteristic of the present disclosure that the third sprocket has a one-way clutch, and does not reversely rotate.

In order to attain the aforementioned object, it is set as a fifteenth characteristic of the present disclosure that a feeder control method according to the present disclosure fits a sprocket hole on a forward end portion of a supply tape inserted from an insertion port with a tooth of a third sprocket, rotates the supply tape until fitting with a tooth of a second sprocket, stops rotation of the third sprocket after the forward end portion of the supply tape fits with the tooth of the second sprocket, and perform fitting of the supply tape with the first sprocket after exposition of an electronic component is performed.

It is set as a sixteenth characteristic of the present disclosure that the aforementioned feeder control method according to the fifteenth characteristic of the present disclosure arranges the interval between the first sprocket and the second sprocket to be closer than the interval between the second sprocket and the third sprocket, the third sprocket includes a third tooth of a round-tooth shape or a shape having a smaller number of catches than the shape of the second tooth of the second sprocket and a one-way clutch not reversely rotating, controls the second sprocket driving motor for rendering the traveling speed of the supply tape resulting from rotation of the third sprocket smaller than the traveling speed of the supply tape resulting from rotation of the second sprocket, controls the first sprocket driving motor for slowing down/stopping the rotation of the second sprocket in a case where a tape pushing detection sensor senses the forward end portion of the supply tape, controls the first sprocket driving motor by a reverse rotation operation according to minimum pitch feeding up to a position where the first detection sensor does not sense the supply tape for rotating the second sprocket by the reverse rotation operation according to the minimum pitch feeding after the slowdown/stoppage of the rotation of the second sprocket, controls the second sprocket driving motor from the position where the first detection sensor does not sense the supply tape, rotates the second sprocket at a prescribed speed, moves the supply tape by a prescribed quantity, high-speed-moves the forward end portion up to a position immediately before reaching a cutter blade of the exposing mechanism, and controls the second sprocket driving motor from the position immediately before reaching the cutter blade of the exposing mechanism for rotating the second sprocket at a prescribed ultralow speed and ultralow acceleration and moving the supply tape by the prescribed quantity.

It is set as a seventeenth characteristic of the present disclosure to have the aforementioned feeder according to any of the first characteristic to the fourteenth characteristic of the present disclosure, while the feeder further includes an interface portion, for performing transmission/receiving of information of the feeder through the interface portion and mounting the electronic component extracted from the feeder on a substrate.

An electronic component mounting method performing a loading operation of carrying the supply tape inserted from the insertion port of the aforementioned feeder according to the first characteristic of the present disclosure into a component outlet port, adsorbing the electronic component exposed by the exposing mechanism and positioned on the component outlet port and mounting the electronic component on a substrate, setting as an eighteenth characteristic of the present disclosure that the electronic component mounting method includes an adsorption anomaly sensing step of sensing an anomaly in adsorption of the electronic component, a terminal end portion detection step of sensing a terminal end portion of the supply tape, and a subsequent supply tape loading step of starting driving of the second sprocket driving motor for starting transportation of a subsequent supply tape inserted into the insertion port by the third sprocket and executing the loading operation in a case of sensing an anomaly in an adsorption operation for the electronic component and the terminal end portion of the supply tape.

In an electronic component mounting device having the aforementioned feeder according to the first characteristic of the present disclosure, in which the feeder is further furnished with a body-side control unit including a detection sensor provided in the downstream direction of the insertion port for sensing the presence or absence of the supply tape and an interface portion, performing transmission/receiving of information to/from the feeder through the interface portion and controlling respective apparatuses, for performing a loading operation of carrying the supply tape inserted from the insertion port up to a component outlet port, adsorbing the electronic component exposed by the exposing mechanism and mounting the electronic component on a substrate, it is as a nineteenth characteristic of the present disclosure that the body-side control unit instructs execution of the loading operation to the feeder when sensing an anomaly in adsorption of the electronic component adsorbed from the outlet port and in a case where the detection sensor senses a terminal end portion of the supply tape, and the control portion starts driving of the second sprocket driving motor in order to start transportation of a subsequent supply tape inserted into the insertion port by the third sprocket and executes the loading operation.

According to the present disclosure, correct fitting of teeth of sprockets set on a plurality of positions and tape feeding holes can be implemented by eliminating influence by a feeding hole accumulated pitch error possessed by a supply tape at the time of loading. Consequently, a feeder, a feeder control method and an electronic component mounting device each having high reliability can be provided.

DETAILED DESCRIPTION

An embodiment of a feeder and a feeder control method as well as an electronic component mounting device according to the present disclosure is now described on the basis of the drawings.

The following description is that for illustrating one embodiment of the present disclosure, and does not limit the range of the present disclosure. Therefore, it is possible for those skilled in the art to employ embodiments replacing these respective elements or all elements with those equivalent thereto, and these embodiments are also included in the range of the present disclosure.

In description of the respective drawings, the same reference numbers are assigned to components having the same functions, and the description is omitted to the utmost, in order to avoid repetition.

EXAMPLE 1

Figure 1:
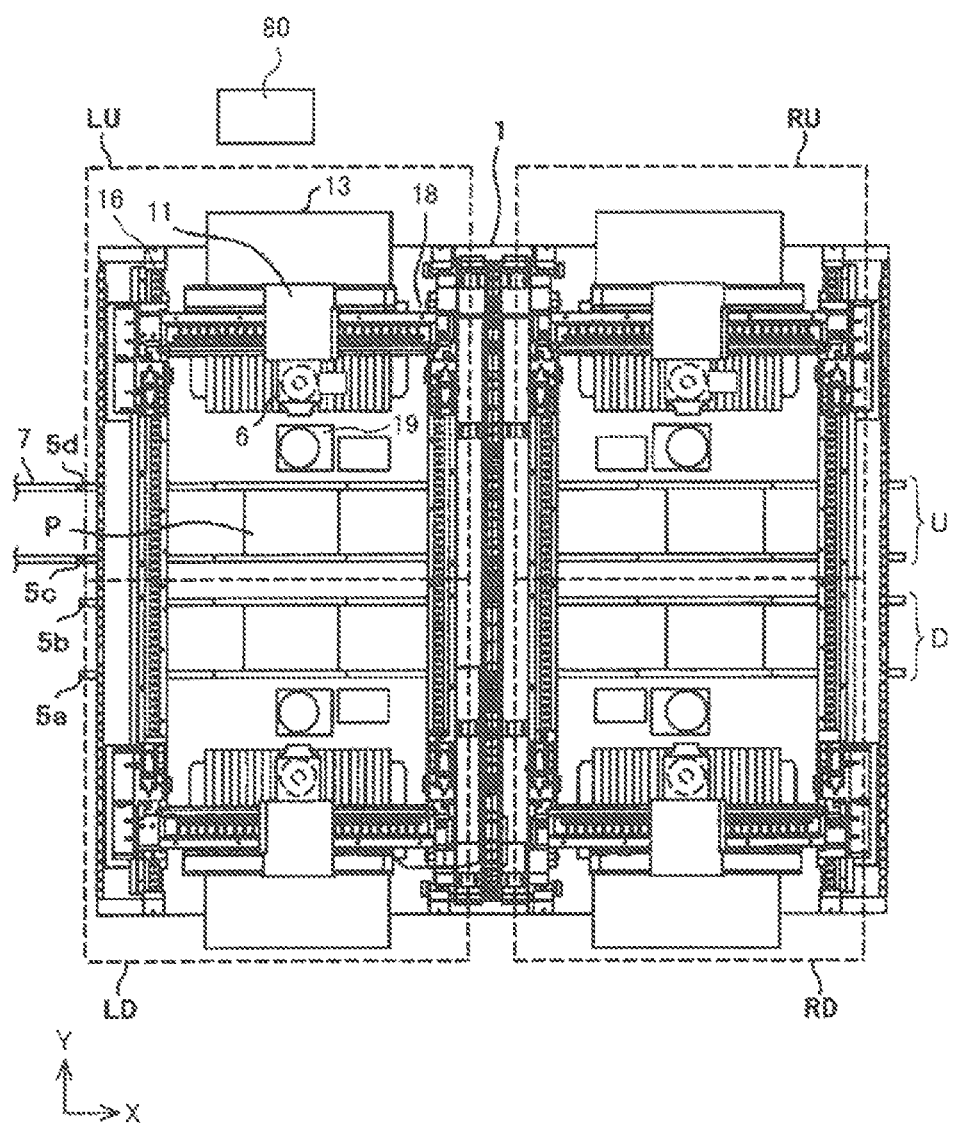
FIG. 1 is a plan view showing the structure of an example of an electronic component mounting device according to the present disclosure.

A first example of the present disclosure is now described. FIG. 1 is a plan view showing the structure of an example of the electronic component mounting device according to the present disclosure. This electronic component mounting device 1 has four blocks in total including two blocks LU and LD on upper and lower portions on the left side and two upper and lower blocks RU and RD on the right side and a control unit 80. In this drawing, signs are basically assigned to only the LU block.

Each block is provided with a component supply area on which a feeder cart loaded with a large number of feeders is set, a mounting head 6, a mounting head body 11 moving the mounting head 6 and a component recognition camera 19 picking up images of adsorbed/held states of electronic components on the mounting head 6. The mounting head body 11 horizontally moves on a horizontal movement rail 18 constituted of a linear motor, and vertically moves on a vertical movement rail 16 constituted of a linear motor similarly to the horizontal movement rail 18.

According to such a structure, an adsorption nozzle of the mounting head 6 fixed to the mounting head body 11 adsorbs electronic components from the component supply area 13, monitors adsorbed/held states of the electronic components with the component recognition camera 19, moves the same to prescribed positions of substrates P, and mounts the adsorbed electronic components on the substrates P.

Such operations are performed in the four blocks. Therefore, four chutes 5a to 5d transporting the substrates P are present at the center, the upper two chutes 5c and 5d constitute a substrate transportation line U for the upper blocks, and the lower two chutes 5a and 5b constitute a substrate transportation line D for the lower blocks. The substrates P are distributed by a delivery portion 7 and carried into the substrate transportation line U or D.

Figure 2:
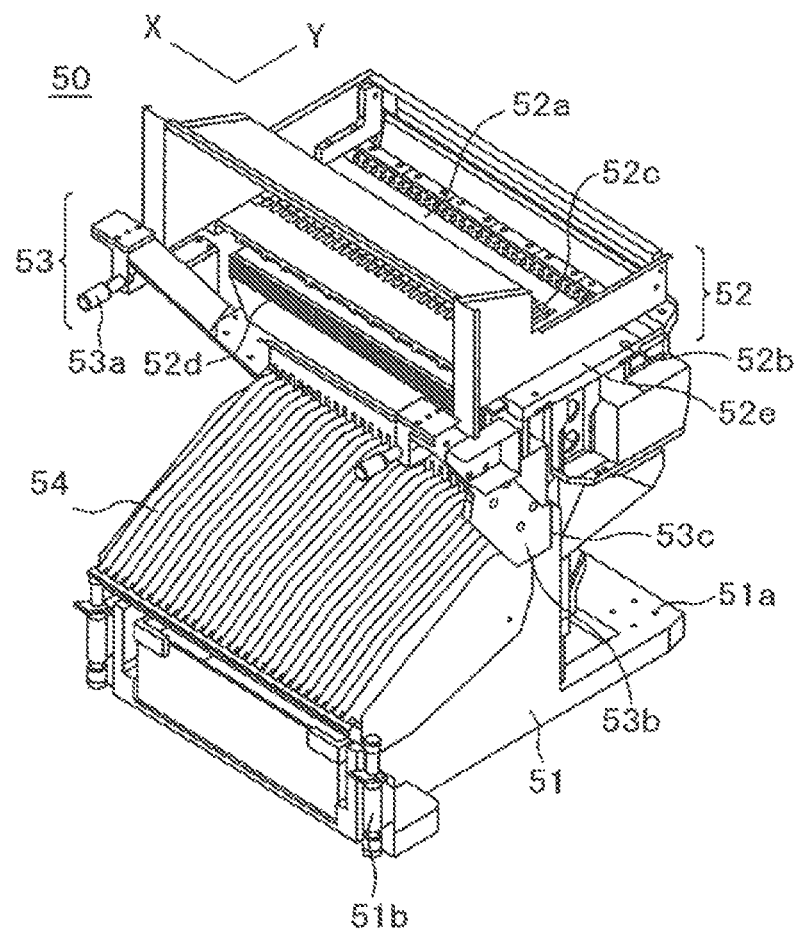
FIG. 2 is a perspective view of an example of a feeder cart in the electronic component mounting device according to the present disclosure.

FIG. 2 is a perspective view of an example of a feeder cart 50 set on the component supply area 13 of the electronic component mounting device 1 of FIG. 1.

The feeder cart 50 shown in FIG. 2 is roughly constituted of a base portion 51, a feeder fixing portion 52 fixing a feeder shown in FIG. 4 described later, a handle portion 53 and a component supply reel storage portion 54 storing a component supply reel 70 (see FIGS. 8A to 8C).

Wheel fixing portions 51a fixing movement wheels (not shown) are present on four portions of four corners in the base portion 51, which has lock pins 51b fixing the feeder cart 50 to the floor surface when the feeder 50 is fixed to a body of the electronic component mounting device 1. The feeder fixing portion 52 is present on an upper portion of the feeder cart 50, places feeders 2 on a feeder base 52a by making feeder fixing portion guides 52c guide cassette fixing portions 35 of the feeders 2, and connects interface portions of the feeders 2 to feeder signal connectors 52d. The feeder fixing portion connectors 52c are regularly arrayed on the feeder base 52a, so that a large number of feeders can be loaded. A supply tape 60 loaded with electronic components 4 is supplied to each feeder 2 from the component supply reel storage portion 54.

On both ends of the feeder base 52a, there are feeder guides 52e playing a role of sliding cart guide plates (not shown) provided on an electronic component mounting device 1 at a time of inserting the feeder cart into the electronic component mounting device 1. Further, positioning holes 52b fixing the feeder cart 50 to the electronic component mounting device 1 are present in the feeder guides 52e. Finally, the handle portion 53 is so present that the feeder cart 50 can be moved/operated, and an operator inserts the feeder cart 50 into the body by moving the same in a Y direction which is the direction of the electronic component mounting device 1 with a handle 53a of the handle portion 53. At this time, a forward end 53c of a side plate 53b of the handle portion 53 plays the role of a stopper preventing the feeder cart 50 from being inserted any further.

Figure 3:
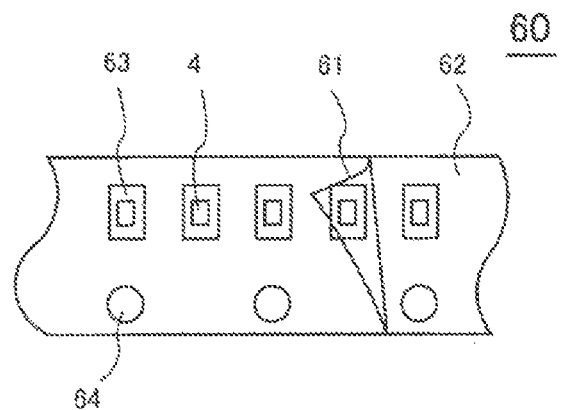
FIG. 3 is a diagram showing a structural example of a general supply tape used in this embodiment.

FIG. 3 is a diagram showing a structural example of a general supply tape used in this embodiment.

In the structure, the supply tape 60 has a carrier tape 62 having pockets 63 storing electronic components 4 and a cover tape 61 covering the carrier tape, and the carrier tape 62 has substantially circular sprocket holes (tape feeding holes) 64 engaging with sprockets (see FIG. 4) described later and moving the supply tape 60 every constant interval (constant pitch) on one end side thereof.

Figure 4:
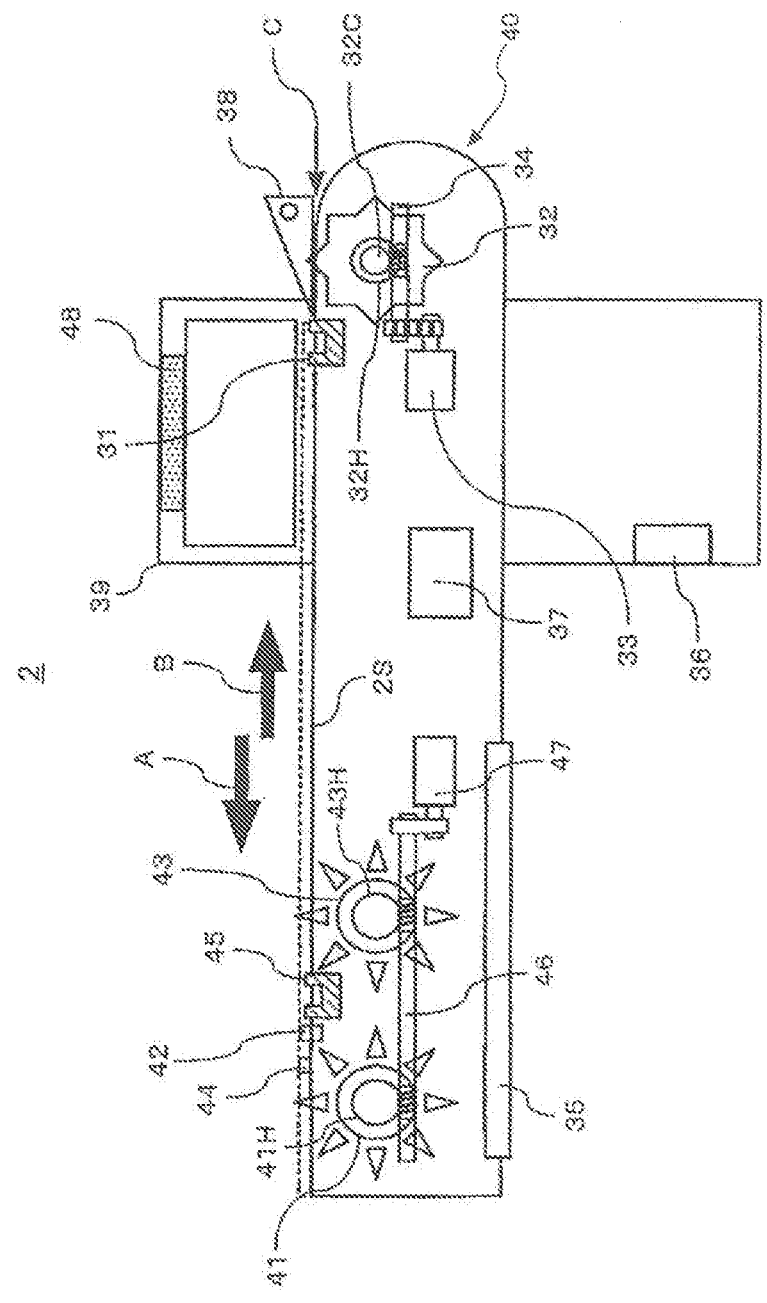
FIG. 4 is a diagram showing the structure of an example of a feeder according to the present disclosure.

FIG. 4 is a diagram showing the structure of an example of the feeder according to the present disclosure. The feeder cart 50 (see FIG. 2) is loaded with a plurality of feeders 2. In the feeder 2 of FIG. 4, the supply tape 60 is not illustrated. In the feeder 2 of FIG. 4, further, the left side of the screen is a downstream direction (forward direction: direction of arrow A), and the right side of the screen is an upstream direction (reverse direction: direction of arrow B). A supply cassette control portion 37 is connected with necessary apparatuses (a tape insertion detection sensor 31, a sprocket driving motor 33, a tape pushing detection sensor 45, a sprocket driving motor 47 etc., for example) of the feeder 2 with unillustrated control lines. As shown in FIG. 4, feeder 2 further includes a feeder body 40.

The feeder 2 of FIG. 4 includes a tape pressing plate 38 pressing the supply tape 60 inserted from an insertion port C, an outlet port 44 for the adsorption nozzle of the mounting head 6 for adsorbing the electronic components and the cassette fixing portion 35 fixing the feeder 2 to the feeder cart 50. The tape pressing plate 38 presses the supply tape 60 on a tape chute 2S (see FIG. 5A or 6A) from above so that the sprocket holes 64 do not come off teeth 32$h$ at a time of loading, and has a structure attachable/detachable to/from the tape chute 2S. The feeder 2 is provided with a third sprocket 32 for inserting a forward end portion 60$a$ of the supply tape 60 into the feeder 2 under this tape pressing plate 38. This third sprocket 32 so rotates as to move the supply tape 60 in the downstream direction, whereby the teeth 32$h$ of the third sprocket 32 fitting with the sprocket holes 64 of the supply tape 60 rotate/move in the forward direction (A direction). Thus, the supply tape 60 moves in the forward direction, and can reach a second sprocket 43. The rotation of the first to third sprockets for moving the supply tape 60 in the downstream direction is hereinafter referred to as forward rotation. Further, the rotation for moving the supply tape 60 in the upstream direction is hereinafter referred to as reverse rotation. In the example of FIG. 4, the three sprockets are set in order of the third sprocket 32, the second sprocket 43 and a first sprocket 41 from the insertion port C of the feeder 2.

Any tooth 32$h$ fitting with any sprocket hole 64 is hereinafter referred to as a tooth 32$h$0 in particular. Similarly, any tooth 43$h$ fitting with any sprocket hole 64 is hereinafter referred to as a tooth 43$h$0 in particular. The feeder 2 of FIG. 4 is horizontally provided with the tape chute 2S, and hence the teeth 32$h$0 and 43$h$0 fitting with the sprocket holes 64 of the supply tape 60 are teeth present on vertical lines passing through rotation centers of the respective sprockets (see FIGS. 5B, 7A, 6B and 7B).

This third sprocket 32 so rotates as to move the supply tape 60 in the downstream direction, whereby the teeth 32$h$ of the third sprocket 32 fitting with the sprocket holes 64 of the supply tape 60 rotate/move in the forward direction (A direction). Thus, the supply tape 60 moves in the forward direction to reach the second sprocket 43, whereby the sprocket hole 64 on the forward end portion 60$a$ of the reaching supply tape and the tooth 43$h$ of the second sprocket 43 fit with each other. Due to rotation of the second sprocket 43, the supply tape 60 moves in the forward direction, and can reach the first sprocket 41.

Therefore, the first sprocket 41 of the feeder 2 processes the cover tape 61 of the supply tape 60 not by pressing/cutting but by pulling the same from the downstream direction.

Further, the feeder 2 includes the sprocket driving motor 33 driving the third sprocket 32 and the sprocket driving motor 47 driving the first sprocket 41 and the second sprocket 43. The supply cassette control portion 37 receives information from the interface 36 transmitting/receiving signals to/from the electronic component mounting device 1 through an unillustrated signal transfer cable and the electronic component mounting device 1 and a signal from the sensor, described later, present in the feeder 2, controls respective portions, and performs signal transfer with the electronic component mounting device 1. The first sprocket 41 and the second sprocket 43 have the sprocket driving motor 47 simultaneously synchronously driving the respective sprockets through a worm gear 46 meshing with worm wheels (teeth 41H and 43H) concentrically provided thereon respectively. Similarly, the sprocket 32 has the sprocket driving motor 33 driving this sprocket 32 through a worm gear 34 meshing with a concentrically provided worm wheel (tooth 32H). The worm gear 46, for example, is gear-cut in the same shaft on positions meshing with the teeth 41H and 43H of the respective sprockets.

The feeder 2 further includes an operation panel 48 in the vicinity of the insertion port C for the supply tape 60 and the tape pressing plate 38. The operation panel 48, provided on a surface of a feeder handle for carrying the feeder 2 in FIG. 4, may be provided on anywhere so far as the same is operable and visually recognizable.

Referring to FIG. 4, driving sources for the third sprocket 32 and the second sprocket 43 are different from each other, and independently drive the same. The second sprocket 43 and the first sprocket 41 employ the same driving source (sprocket driving motor 47). In other words, the supply cassette control portion 37 controls and rotates the sprocket driving motors 33 and 47 on the basis of control from the body 1, control from the operation panel 48 or at least either detection signal from the tape insertion detection sensor 31 or the tape pushing detection sensor 45. The sprocket driving motor 33 transmits the torque thereof to the third sprocket 32 through a belt and the worm gear 34. The third sprocket 32 rotates at a prescribed rotational speed in a prescribed direction due to the transmitted torque.

The third sprocket 32 performs an operation of pushing the supply tape 60 in the downstream direction on the tape chute 2S, in order to fit the sprocket hole 64 on the forward end portion 60$a$ of the supply tape 60 with the tooth 43$h$0 of the second sprocket 43 of the feeder 2. Further, the second sprocket 43 performs an operation of pushing the electronic components 4 into the outlet port 44.

At a time of a loading operation, the sprocket hole on the forward end portion 60$a$ of the supply tape 60 fitting with any tooth 32$h$ of the third sprocket 32 and moving in the downstream direction reaches the second sprocket 43. The sprocket hole 64 on the forward end portion 60$a$ of the supply tape 60 reaching the second sprocket 43 fits with any tooth 43$h$ of the second sprocket 43, and the supply tape 60 thereafter moves on the tape chute 2S due to the torque of the second sprocket 43 whose rotational speed is high (transfer resulting from speed difference). In other words, the tooth 32$h$ moving at a high speed can follow and fit with the sprocket hole 64 at the head of the tape 60 moving at a high speed even if the same is at first present on a deviational position.

At the time of the aforementioned transfer, the sprocket hole 64 on the forward end portion 60$a$ of the supply tape 60 does not immediately fit with the tooth 43$h$ of the second sprocket 43, but fits with the same after slightly sliding (clearance loss). The tape pushing detection sensor 45 is provided on a downstream side of the second sprocket 43 in order to reliably grasp the forward end portion 60$a$, in consideration of this clearance loss.

At the time of the loading operation, the supply cassette control portion 37 controls the sprocket driving motor 47 to slow down/stop the rotation of the second sprocket 43 in a case where the tape pushing detection sensor 45 senses the forward end portion 60$a$ of the supply tape 60.

The first sprocket 41 mainly drives the supply tape 60. The feeder 2 further has a pressing mechanism (not shown) pressing the supply tape 60 against the side of the first sprocket 41 and the outlet port 44 for the adsorption nozzle of the mounting head 6 for adsorbing the electronic components 4, so that the first sprocket 41 reliably fits with the sprocket holes 64 (see FIG. 3).

The outlet port 44 is provided between the first sprocket 41 of the tape chute 2S and the second sprocket 43.

The pressing mechanism has a separation mechanism (exposing mechanism exposing the electronic components 4 to be extractable) 42 cutting or peeling the cover tape 61 shown in FIG. 3 for separating the same from the carrier tape 62, in order to extract the electronic components 4 from the supply tape 60. For example, the separation mechanism 42 has a cutter cutting the cover tape 61 and a cover tape guide (not shown) guiding the cut cover tape not to obstruct the extraction of the electronic components 4 at the outlet port 44. The shape of the cover tape guide portion as viewed from above is a triangular shape having vertexes on cutter mounting portions.

Therefore, the cut cover tape 61 moves along the cover tape guide while opening on both left and right sides (direction perpendicular to the plane of FIG. 4). On the other hand, the carrier tape 62 from which the cut cover tape has been separated moves toward the outlet port 44 which is a component extracting position.

Further, the electronic component mounting device 1 has a cutting mechanism (not shown) cutting the carrier tape 62 from which the cover tape 61 has been peeled off into a prescribed length in the downstream direction of the first sprocket 41 of the feeder 2. This prescribed length is larger than the length of a space between positions where the respective ones of the second sprocket 43 and the third sprocket 32 fit with the sprocket holes 64. In a case where the cover tape 61 having covered the carrier tape 62 is cut open in the direction of movement of the supply tape 60 in the vicinity of the centers of the pockets 63 in a direction orthogonal to the direction of movement (longitudinal direction) of the supply tape 60 and both sides of the cover tape 61 remain on the supply tape 60 in a state welded (connected) to the carrier tape 62, the supply tape 60 is cut with the cutting mechanism as such.

Therefore, the cover tape 61 of the supply tape 60 is subjected to cut-open processing not by pressing/cutting but by pulling the supply tape 60 of the feeder 2, whereby the cover tape is not peeled off. Consequently, formation of peeling scraps or paper fluffs is small, and formation of dust becomes reducible.

Further, the cover tape 61 is delivered in the upstream direction along with the supply tape 60 to be cut as hereinabove described, whereby a recovery operation and a recovery mechanism, which have been necessary in a conventional feeder, for a peeled-off cover tape are unnecessary.

The first sprocket 41 pulls the forward end portion 60a of the supply tape 60 toward the separation mechanism 42 when loading the supply tape 60 on the feeder 2. The feeder 2 has the tape insertion detection sensor 31 detecting the presence or absence of the supply tape between the outlet port 44 present in the upstream direction of the first sprocket 41 and the second sprocket 43.

A loading function of mounting the supply tape 60 on the feeder 2 not yet mounted with the supply tape 60 is now described with reference to FIG. 4. The loading operation mentioned here denotes a series of operations of inserting the supply tape 60 into the feeder 60 and automatically carrying the supply tape 60 up to the outlet port 44 which is the component extraction position of the supply tape 60. This operation is possible also when the electronic component supply device (body) 1 is in operation.

When newly setting the supply tape 60 on the feeder 2, the operator reads a bar code appended to a reel of the supply tape 60 with a bar code reader coupled to the component mounting device, for example, in order to prevent discrepancy. This bar code contains information of the electronic components 4 stored in the supply tape 60. The read bar code information is transmitted to the electronic component mounting device 1.

The control unit 80 (see FIG. 1) of the electronic component mounting device 1 determines whether or not the received bar code information coincides with feeder information to be set. The control unit 80 operates to continue the operation as such when the bar code information and the feeder information coincide with each other, while outputting an alarm and stopping an automatic insertion operation when the same do not coincide with each other. For example, the sprocket driving motor 33 does not rotate and the third sprocket 32 does not rotate either even if a feed button (described later) of the operation panel 48 is pressed, and hence the same does not perform an operation of feeding (loading). Thus, discrepancy is prevented.

The control unit 80 transmits a command to the feeder 2 when the bar code information and the feeder information coincide with each other. The operation panel 48 is so operated that the feeder 2 receiving this command continues the loading operation.

Figure 8A:
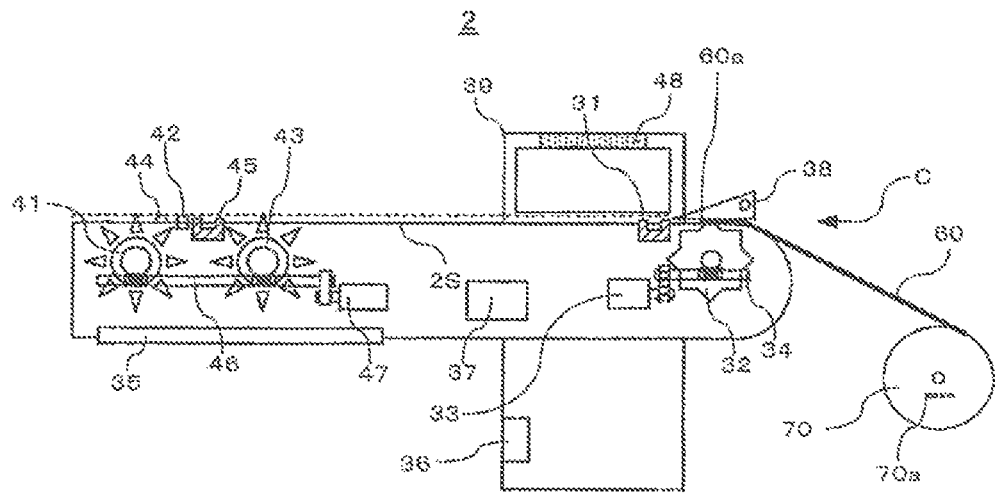
FIG. 8A is a diagram showing a first half step of a loading operation for the supply tape according to the present disclosure.
Figure 8B:
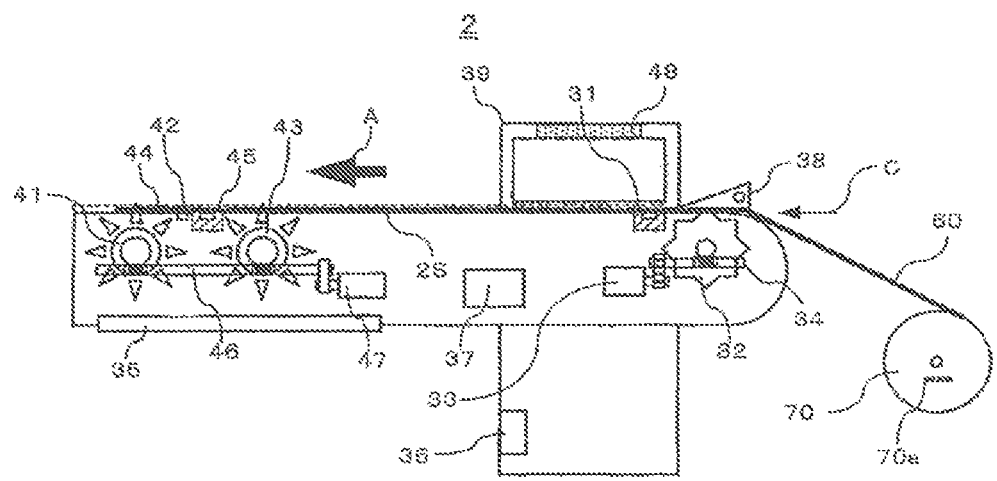
FIG. 8B is a diagram showing a second half step of the loading operation for the supply tape according to the present disclosure.
Figure 8C:
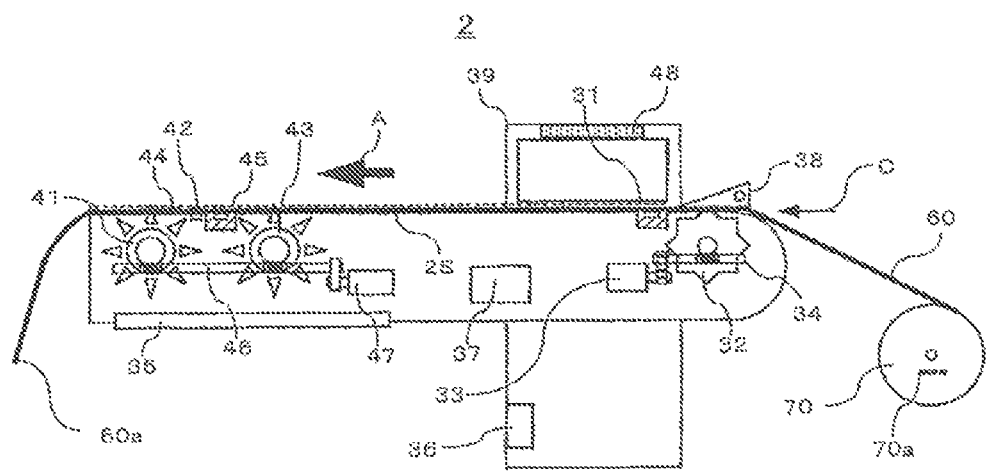
FIG. 8C is a diagram showing a state after termination of the loading operation for the supply tape according to the present disclosure.

In other words, the operator sets the supply tape 60 on an introduction portion (component supply reel storage portion 54 (see FIG. 2)) at the time of the loading operation, as shown in FIG. 8A.

Then, the operator inserts the forward end portion 60a of the supply tape 60 from the tape insertion port C under the tape pressing plate 38 up to a position where any sprocket hole 64 and any tooth of the sprocket fit with each other on the third sprocket 32.

The operator may detach the tape pressing plate 38, insert the forward end portion 60a of the supply tape 60 into the position where the tooth 32h0 of the third sprocket 32 and the sprocket hole 64 fit with each other, and thereafter mount the tape pressing plate 38.

Then, the operator presses a loading button 105 of the operation panel 48.

The supply cassette control portion 37 of the feeder 2 senses that the loading button 105 of the operation panel 48 has been pressed, and rotates the third sprocket 32 in the forward direction. Due to this rotation, the supply tape 60 is delivered in the A direction, and reaches the position where the sprocket hole 64 on the forward end portion 60a of the supply tape 60 fits with the tooth of the second sprocket 43, as shown in FIG. 8B. The tape pressing plate 38 is so present that the supply tape 60 can be reliably pushed into the second sprocket 43 with the third sprocket 32 in this manner.

The second sprocket 43 starts rotation when a prescribed time lapses after the third sprocket 32 starts rotation and the tape insertion detection sensor 31 detects the supply tape 60. This prescribed time is shorter than a time required by the forward end portion 60a of the supply tape 60 to reach the fitting position of the second sprocket 43 from the position of the tape insertion detection sensor 31 upon rotation of the third sprocket 32.

The tape insertion detection sensor 31 is set in the vicinity of the tape chute 2S between the teeth 32h of the third sprocket 32 and the teeth 43h of the second sprocket 43, as shown in FIG. 4.

The rotational frequency of the third sprocket 32 in the feeder 2 is at a lower speed than the rotational frequency of the second sprocket 43. Therefore, the driving sources for the third sprocket 32 and the second sprocket 43 are different from each other, and independently drive the same. The third sprocket 32 stops the rotating after the supply tape insertion operation terminates, while the second sprocket 43 and the first sprocket 41 rotate during an ordinary component mounting operation.

Figure 6B:
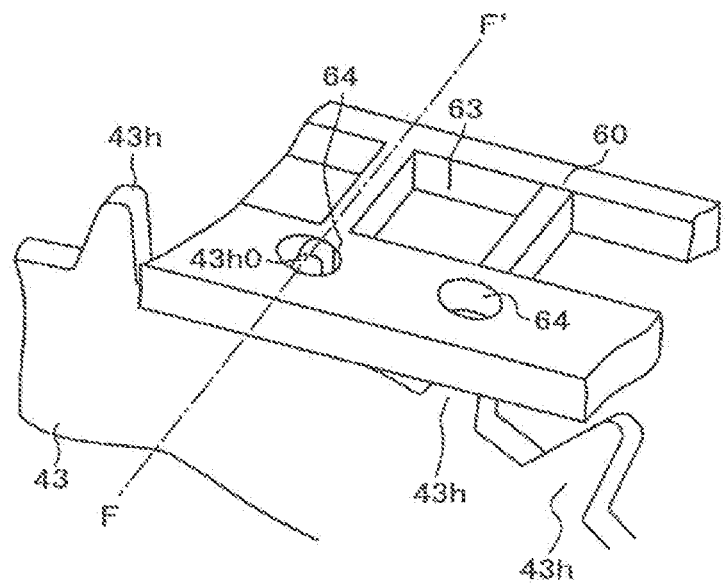
FIG. 6B is a diagram for illustrating an example of a first sprocket fitting with the sprocket holes of the supply tape in the feeder according to the present disclosure.
Figure 7A:
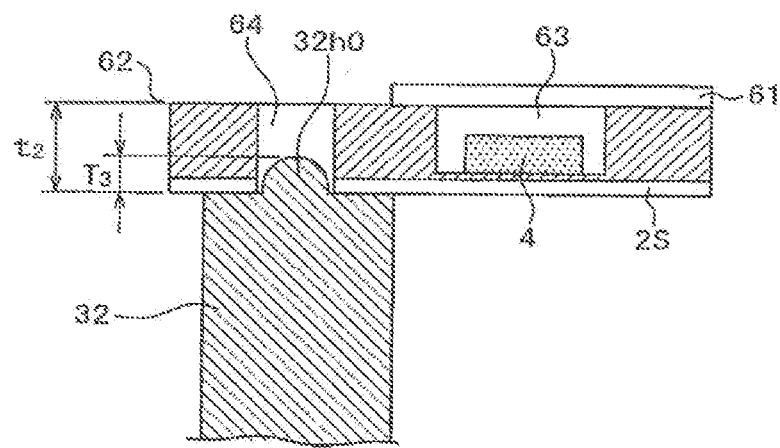
FIG. 7A is a sectional view showing an example of a position cut into a sprocket hole in order to insert the supply tape fitting with a tooth of the third sprocket in the feeder according to the present disclosure.

When the sprocket holes 64 of the supply tape 60 and the teeth 43h of the second sprocket 43 fit with each other, the supply tape 60 synchronizes with the rotation of the second sprocket 43, since the rotation of the second sprocket is at a higher speed than the rotation of the third sprocket 32. This is because the third sprocket 32 has such a shape that the teeth 32h have a small number of catches in the form of round teeth such as circular mounds, as shown in FIGS. 5B and 7A. Therefore, catch resistance of the teeth 43h of the second sprocket 43 is larger than that of the teeth 32h of the third sprocket 32 (see FIGS. 6B and 7B), whereby the sprocket holes 64 move not according to the rotation of the third sprocket 32, but according to the rotation of the second sprocket 43. FIGS. 5B and 6B do not illustrate the tape chute 2S.

As hereinabove described, the rotation of the third sprocket 32 is slower than the rotation of the second sprocket 43 at the time of the supply tape insertion operation. Therefore, the third sprocket 32 stores a one-way clutch 32C and rotates in the direction (forward direction, the direction shown by arrow A) for inserting the supply tape 60, while not rotating in the reverse direction (direction shown by arrow B).

Further, the traveling speed (circumferential speed of the second sprocket 43) of the supply tape 60 resulting from the rotation of the second sprocket 43 is higher than the traveling speed (circumferential speed of the third sprocket 32) of the supply tape 60 resulting from the rotation of the sprocket driving motor 33 for the third sprocket 32. The third sprocket 32 is rotatable in the forward direction due to the one-way clutch 32C. Thus, the third sprocket 32 is pulled by the supply tape 60 and can rotate in the forward direction, due to the movement of the supply tape 60 in the forward direction resulting from the rotation of the second sprocket 43. The one-way clutch 32C is so provided that the third sprocket 32 rotates in the forward direction and does not rotate in the reverse direction with respect to a rotary shaft (coaxial with a rotation axis of the third sprocket 32) rotating by the sprocket driving motor 33.

Figure 5A:
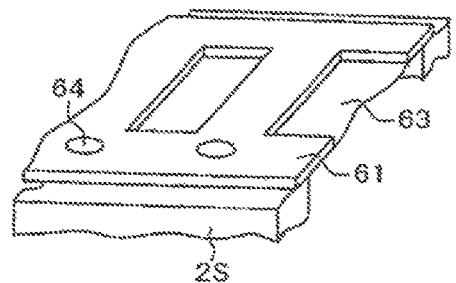
FIG. 5A is a perspective view showing a supply tape and a tape chute used in the present disclosure.
Figure 5B:
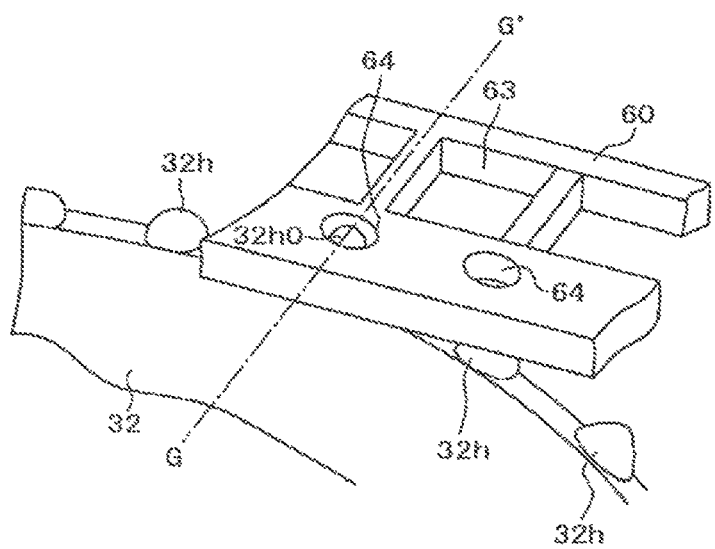
FIG. 5B is a diagram for illustrating an example of a third sprocket fitting with sprocket holes of the supply tape in the feeder according to the present disclosure.

Each tooth 32h of the third sprocket 32, whose height $T_3$ is rendered smaller than the thickness $t_2$ of the carrier tape 62, is brought into a smooth curved surface shape having no corners such as circular mounds, as shown in FIGS. 5A, 5B and 7A. Further, each tooth 43h of the second sprocket 43, whose height $T_2$ is rendered larger than the thickness $t_2$ of the carrier tape 62, is brought into a sharp angle shape such as a pin shape as compared with the tooth 32h, as shown in FIGS. 6A, 6B and 7B.

Figure 6A:
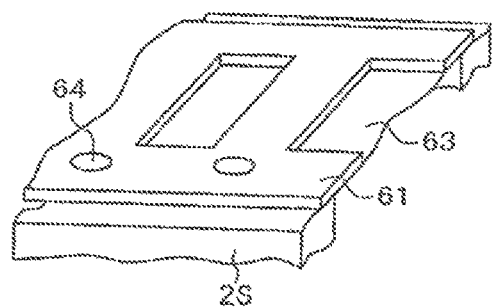
FIG. 6A is a perspective view showing the supply tape and the tape chute used in the present disclosure, and a diagram identical to FIG. 5A.
Figure 7B:
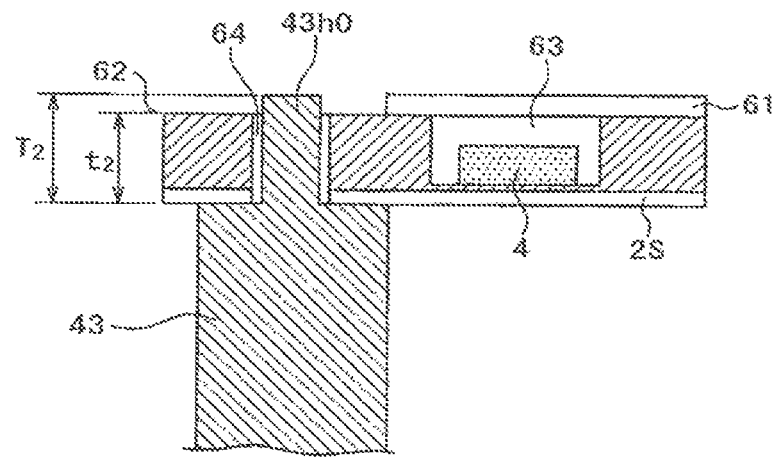
FIG. 7B is a sectional view showing an example of a position cut into a sprocket hole in order to insert the supply tape fitting with a tooth of a second sprocket in the feeder according to the present disclosure.

Referring to FIG. 5A or 6A, the tape chute 2S is a guide generally horizontally provided on an upper portion of the feeder 2, for moving the supply tape 60 on this tape chute 2S. The supply tape 60 moves on the tape chute 2S of the feeder 2 while sliding.

Consequently, the supply tape 60 moves following the rotation of the second sprocket 43 in a case where the sprocket holes 64 of the supply tape 60 fit with the teeth 43h of the second sprocket 43 at the time of the loading.

Therefore, the feeder 2 can automatically load the supply tape 60 also in a case where the interval between the third sprocket 32 and the second sprocket 43 is large and the fitting between the teeth of the second sprocket 43 and the sprocket holes 64 and the fitting between the teeth of the third sprocket 32 and the sprocket holes 64 are simultaneously impossible due to a feeding hole accumulated pitch error of the supply tape 60.

Thereafter the supply cassette control portion 37 of the feeder 2 stops the rotation of the third sprocket 32.

In the feeder 2 shown in FIG. 4, the sprocket driving motor 47 driving the first sprocket 41 and the second sprocket 43 is a servomotor, and servo-controlled by the supply cassette control portion 37. The sprocket driving motor 33 driving the third sprocket 32 is a DC motor, and open-controlled by the supply cassette control portion 37.

The first sprocket 41 is a feeding mechanism mainly functioning as a feed dog deciding feeding/positioning accuracy. For example, the first sprocket 41 can improve the posture of the supply tape 60, stabilization of traveling (rectilinear progressiveness) and robustness according to a double sprocket system combined with the second sprocket 43.

The second sprocket 43 is a feeding mechanism for performing delicate feed control of inserting the forward end portion 60a of the supply tape 60 into a tape processing portion (the tape pushing detection sensor 45, the separation mechanism 42, the outlet port 44 etc.) in the downstream direction beyond the second sprocket 43. For example, the second sprocket 43 finely controls the loading operation of the forward end portion 60a of the supply tape 60 to the separation mechanism 42 with a servomotor driving capable of ensuring an ultralow speed feeding torque at the time of supply tape loading. The second sprocket 43 performs a dependent/auxiliary operation for the first sprocket 41 after the forward end portion 60a of the supply tape 60 reaches the first sprocket 41.

The third sprocket 32 is a feeding mechanism moving the supply tape 60 in the downstream direction until the tape pushing detection sensor 45 senses the supply tape 60. The rotational frequency of the third sprocket 32 is about half the rotational frequency of the second sprocket 43 at the time of the supply tape loading. Even if a tape hole accumulated pitch error at the time of the supply tape loading is large, influence therefrom can be consequently absorbed, and the teeth 43h of the second sprocket 43 can reliably fit with the sprocket holes 64 of the supply tape 60. Further, the tape 60 fits with the round sprocket teeth of the third sprocket 32 thereby traveling on these sprocket teeth while sliding to some extent, while the third sprocket 32 can rotate while being pulled by the tape 60 due to the one-way clutch 32C, and the tape 60 can travel in a substantially unresisted manner.

In addition, the interval between the first sprocket 41 and the second sprocket 43 is arranged to be closer than the interval between the second sprocket 43 and the third sprocket 32, and set to a span not influenced by the accumulated pitch error of the sprocket holes 64 of the supply tape 60.

As hereinabove described, the sprocket driving motor 47 driving the first sprocket 41 and the second sprocket 43 has been formed by the servomotor and employed as the same driving source, in order to enable acceleration/deceleration control, speed control and torque control necessary in a tape processing sequence. The tape processing sequence is illustrated with reference to a timing chart of FIG. 9 described later.

Referring to FIG. 4, the supply tape 60 is driven to be pulled by the driving sprocket 41 at the time of ordinary extraction of the electronic components 4, and hence the cover tape is also reliably cut following this. At the time of loading (insertion into the feeder) of the supply tape 60, however, the supply tape 60 is pushed into the cutter of the separation mechanism 42 by the second sprocket 43 from the forward end portion 60a thereof. When moving the supply tape at a speed at the time of an electronic component extraction operation and pressing the same, therefore, an acceleration becoming a pressing force is large. Consequently, the speed at which the supply tape 60 moves is high and hence there is an apprehension that the cover tape 61 is not successfully cut. Therefore, the sprocket driving motor 47 is controlled before the forward end portion 60a of the supply tape 60 reaches the position of the cutter, to insert the supply tape 60 into the cutter of the separation mechanism 42 at a low speed and low acceleration.

In other words, when the tape pushing detection sensor 45 senses the supply tape 60, the supply cassette control portion 37 stops the rotation of the sprocket driving motor 33 and controls the sprocket driving motor 47, to insert the supply tape 60 into the cutter of the separation mechanism 42 at the low speed and low acceleration.

Consequently, the separation mechanism 42 can reliably cut the cover tape 61 without buckling the supply tape 60, move the supply tape 60 and position the headmost pocket 63 on the outlet port 44 for the electronic components 4.

Figure 9:
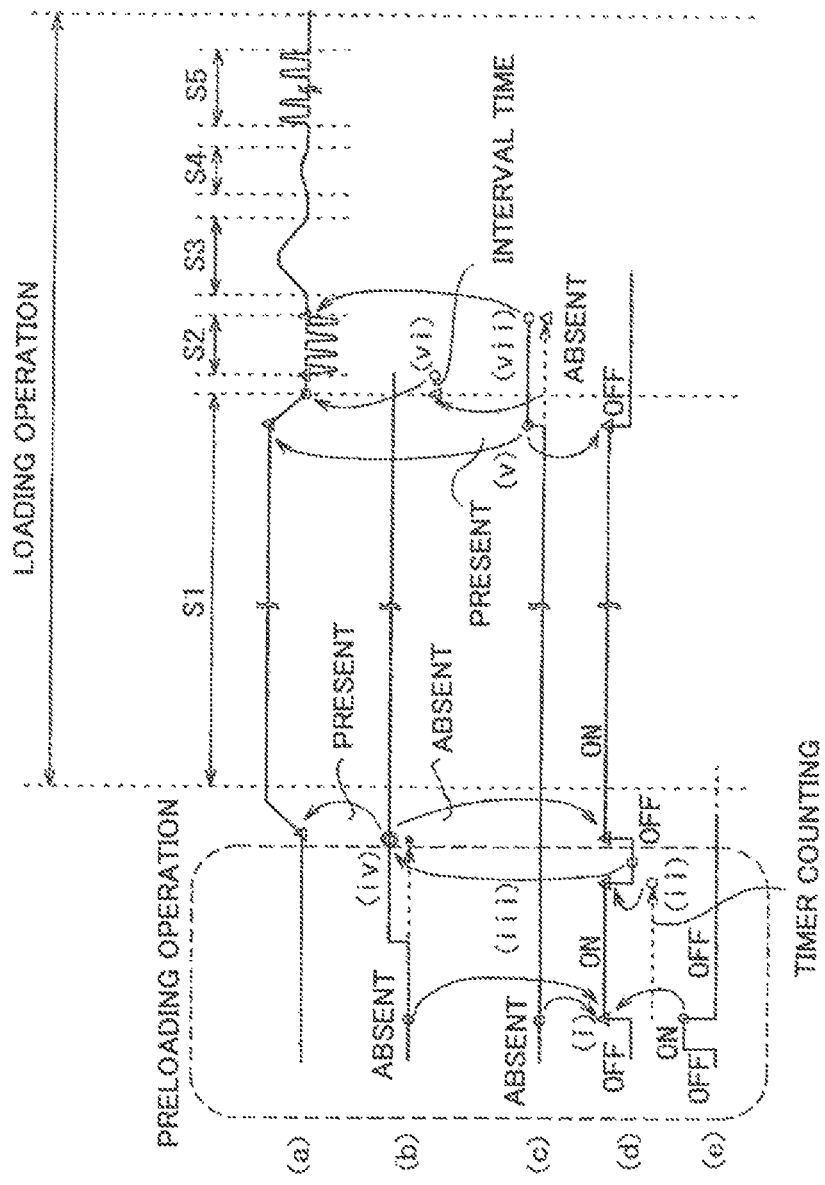
FIG. 9 is a timing chart showing operations of respective portions in the loading operation according to the present disclosure.

The operation of loading the supply tape 60 on the feeder 2 is now described in more detail by employing FIGS. 4, 8A, 8B and 9. FIG. 9 is a diagram showing an operation timing chart of each portion in this operation.

(a) shows the operation of the sprocket driving motor 47, and the axis of ordinates shows speeds. Referring to the speeds at (a), a plus speed indicates movement of the supply tape 60 in the arrow A direction (forward direction) shown in FIG. 4, and a minus speed indicates movement in the arrow B direction (reverse direction) shown in FIG. 4.

(b) shows the presence or absence of sensing of the tape insertion detection sensor 31, with a High level for "present" and a Low level for "absent".

(c) shows the presence or absence of sensing of the tape pushing detection sensor 45, with a High level for "present" and a Low level for "absent".

(d) shows ON and OFF of the operation of the sprocket driving motor 33, with a High level for "ON" and a Low level for "OFF".

(e) shows ON and OFF of the loading button 105 (see FIG. 10A) of the operation panel 45, with a High level for "ON" and a Low level for "OFF".

Respective steps are now described with reference to FIG. 9. The tape insertion detection sensor 31 and the tape pushing detection sensor 45 regularly monitor the presence or absence of the tape, and output sensing signals to the supply cassette control portion 37 when changing from the absence to the presence and from the presence to the absence.

First, a preloading operation is described.

The operator detaches the tape pressing plate 38, inserts the forward end portion 60a of the supply tape 60 onto the tape chute 2S, fits the tooth 32h0 of the second sprocket 32 and the sprocket hole 64 with each other, and mounts the tape pressing plate 38 from above.

Then, the operator presses the loading button 105 of the operation panel 48.

In place of pressing the loading button 105, the operator may press an unillustrated start SW starting an automatic operation of extracting the electronic components 4 from the feeder 2 and mounting the same on the substrates P according to mounting data prepared for every type of the substrates P in an unillustrated operation portion of the electronic component mounting device 1 for making the same execute the operations described below.

State (i)

In a case where the loading button 105 turns ON, the supply cassette control portion 37 turns ON the sprocket driving motor 33 after the loading button 105 turns ON and a prescribed interval time T1 elapses when sensing results of the tape insertion detection sensor 31 and the tape pushing detection sensor 45 are both states of "absent". Further, the same starts a timer simultaneously with the ON operation of the sprocket driving motor 33.

State (ii)

The supply cassette control portion 37 turns OFF the sprocket driving motor 33 after a prescribed time T0 elapses in the timer.

State (iii)

The supply cassette control portion 37 confirms which one of "presence" and "absence" of the supply tape the tape insertion detection sensor 31 senses after a prescribed interval time T2 elapses after turning OFF the sprocket driving motor 33.

The supply cassette control portion 37 keeps the sprocket driving motor 33 OFF and terminates the preloading operation in a case where the sensing result of the tape insertion detection sensor 31 is "absent".

State (iv)

The supply cassette control portion 37 turns ON the sprocket driving motor 33 and starts a rotational operation of the sprocket driving motor 47 in a case where the sensing result of the tape insertion detection sensor 31 is "present" (makes transition to a step S1).

Step S1

At this time, the supply cassette control portion 37 rotates the sprocket driving motor 47 according to a previously set tape feed rate. Further, the supply cassette control portion 37 monitors the sensing result of the tape pushing detection sensor 45 during the movement (during tape feeding) of the supply tape 60.

State (v)

The supply cassette control portion 37 slows down/stops (OFF) the sprocket driving motor 47 and turns OFF the sprocket driving motor 33 having rotated interlockingly with the sprocket driving motor 47 without waiting a prescribed stroke movement completion in a case where the sensing result of the tape pushing detection sensor 45 is "present".

Further, the supply cassette control portion 37 irregularly stops the feeder 2 and turns OFF the sprocket driving motor 33 in a case where the sensing result of the tape pushing detection sensor 45 remains "present", even if the rotational operation according to the previously set tape feed rate completes.

In other words, the sprocket driving motors 47 and 33 rotate together so that the supply tape is inserted into the feeder 2 at the step S1. The supply cassette control portion 37 stops the rotation of the sprocket driving motor 33 and forcibly slows down/stops the sprocket driving motor 47 at a time when the tape pushing detection sensor 45 senses the forward end portion 60a of the supply tape 60. In a case where the tape pushing detection sensor 45 does not sense the forward end portion 60a of the supply tape 60 even if the same performs feeding (rotation of a prescribed quantity) of the prescribed quantity, the supply cassette control portion 37 irregularly stops the feeder 2.

Step S2

The supply cassette control portion 37 waits for a prescribed interval time T3 after the rotation stoppage of the sprocket driving motor 47.

State (vi)

The supply cassette control portion 37 repeats a reverse feeding operation of the sprocket driving motor 47 at the minimum pitch (taping standard: 1 mmP) until the sensing result of the tape pushing detection sensor 45 becomes "absent" after a lapse of the prescribed interval time T3.

State (vii)

The supply cassette control portion 37 stops the reverse feeding operation of the sprocket driving motor 47 in a case where the sensing result of the tape pushing detection sensor 45 becomes "absent".

The supply cassette control portion 37 makes a transition to a step S3 after a lapse of a prescribed interval time T4 from the state (vii).

In other words, the supply cassette control portion returns the supply tape 60 by a reverse rotational operation according to minimum pitch feeding until the tape pushing detection sensor 45 does not sense the supply tape (deviates from a sensing range) for position definition of the forward end portion 60a of the supply tape 60 in consideration of an overrun quantity at the step S1. At this time, the sprocket driving motor 47 reversely rotates at the minimum pitch, while the sprocket driving motor 33 stops (OFF) the rotation. While the third sprocket 32 does not reversely rotate due to the one-way clutch 32C, the supply tape 60 fitting with the second sprocket 43 slides and moves on the tape chute 2S in the downstream direction due to thrust of the sprocket driving motor 47, since the return quantity is small (minimum pitch) and the height of the tooth 32h of the third sprocket 32 is small.

Step S3

The supply cassette control portion 37 performs a high-speed tape feeding operation (single feeding) of a prescribed quantity by rotating the sprocket driving motor 47 at a prescribed speed in a previously set step S3 feeding/driving waveform. The prescribed quantity is a feed rate from a position where the forward end portion 60a has stopped at the step S2 up to a position immediately before reaching a cutter blade of the separation mechanism 42.

In other words, the forward end portion 60a of the supply tape 60 is delivered to a position immediately in front of the cutter blade of the separation mechanism 42 by a single feeding operation of the prescribed quantity at the step S3. This is because the forward end portion 60a has stopped on a prescribed position and hence the position of the forward portion 60a has been defined at the step S2. A space between the cutter blade and the prescribed position is set according to design dimensions, and hence the supply tape 60 can move to the position immediately in front of the cutter blade when feeding the supply tape in the downstream direction by the length.

Step S4

The supply cassette control portion 37 performs the tape feeding operation by rotating the sprocket driving motor in a previously set step S4 feeding/driving waveform (single feeding).

In this step S4 feeding/driving waveform, the supply cassette control portion 37 rotates the sprocket driving motor at an ultralow speed and ultralow acceleration. The ultralow speed and ultralow acceleration signify that the supply tape is at a lower speed and lower acceleration as compared with the speed at which the sprocket driving motor 47 rotates in the aforementioned state (iv) and at a lower speed and lower acceleration also as compared with a speed at which the supply tape 60 is fed in a case of adsorbing ordinary electronic components 4.

In other words, the supply cassette control portion 37 performs "insert→cover tape cut-opening" in a supply tape insertion sequence into a cover tape cut-opening zone of the separation mechanism 42. For example, the supply cassette control portion 37 rotates the sprocket driving motor 47 at the ultralow speed and ultralow acceleration, and performs single feeding with the prescribed quantity. Consequently, the supply cassette control portion 37 performs a prescribed feeding operation at the ultralow speed and ultralow acceleration, whereby the same can open the cover tape 61 in a Russell manner without peeling the same off the supply tape 60.

Step S5

The supply cassette control portion 37 rotates the sprocket driving motor 47 at a prescribed feed rate and a prescribed feed frequency according to component library setting (feed pitch) for the components stored in the supply tape 60.

In other words, the supply cassette control portion 37 performs a pitch feeding operation by a prescribed number of times in total for cuing the position of the pocket 63 on the forward end portion 60a of the supply tape 60 into an adsorption position (outlet port 44) at a step S5. As to a feed rate and a feed frequency at this time, a predetermined data table is employed for every feed pitch for the supply tape. The data table is stored in the control unit 80 of the electronic component mounting device 1, and the supply cassette control portion 37 incorporates and uses necessary information through the feeder signal connectors 52d.

Figure 10A:
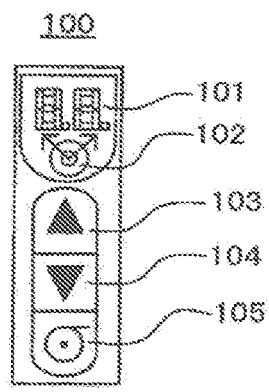
FIG. 10A is a diagram showing an example of an operation panel surface of an operation panel of the feeder according to the present disclosure.

The operation panel of the feeder according to the present disclosure is now described according to FIGS. 10A, 10B, 10C and 10D. FIG. 10A is a diagram showing an example of an operation panel surface 100 of the operation panel 48 of the feeder 2 according to the present disclosure.

The operator selects a lane to be selected on the operation panel surface 100, and selects the lane by pressing a lane selection key 102. Then, when the operator presses the loading button 105 for at least 1 sec., the supply cassette control portion 37 recognizes this operation, and selects the lane.

The supply cassette control portion 37 feeds the supply tape 60 in the forward direction while the operator presses a feed button 103, and feeds the supply tape 60 in the reverse direction while the operator presses a return button 104. Further, the supply cassette control portion 37 starts the loading operation for the feeder 2 when the operator presses the loading button 105.

A digital display portion 101 displays which lane is selected and whether the device is in a loading operation or in an unloading operation. Thus, the feeder generally has left and right two lanes, each capable of supplying one supply tape.

Figure 10B:
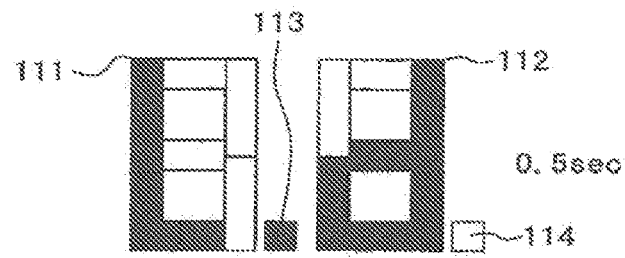
FIG. 10B is a diagram showing an example of a digital display portion of the operation panel surface of the operation panel of the feeder according to the present disclosure.
Figure 10C:
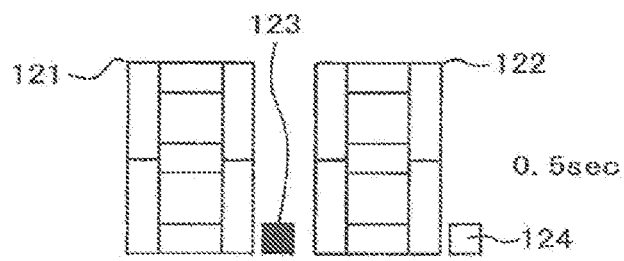
FIG. 10C is a diagram showing the example of the digital display portion of the operation panel surface of the operation panel of the feeder according to the present disclosure.
Figure 10D:
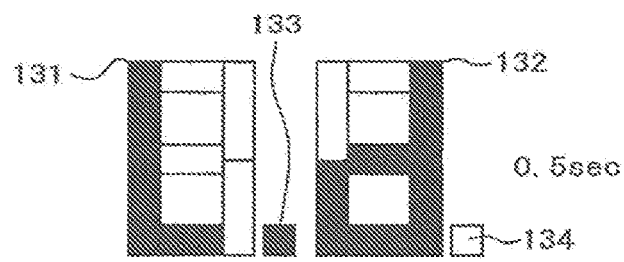
FIG. 10D is a diagram showing the example of the operation panel surface of the operation panel of the feeder according to the present disclosure.

FIGS. 10B to 10D are diagrams showing details of the digital display portion 101 of FIG. 10A.

As to the display on the digital display portion 101, 7-seg display is performed during the loading operation. In the display, the same display continues for a prescribed time (for 0.5 sec., for example), and is successively repeated as FIG. 10B→FIG. 10C→FIG. 10D→FIG. 10B . . . .

It means that a first lane is selected when dots 113, 123 and 133 are displayed, while it means that a second lane is selected when dots 114, 124 and 134 are displayed.

In a case where the aforementioned loading operation is performed in a state where the feeder cart 50 is set on the electronic component mounting device 1, the electronic component mounting device 1 can start a mounting operation by receiving loading operation completion from each feeder.

In a case where the aforementioned loading operation is performed in a state where the feeder cart 50 is not set on the electronic component mounting device 1, on the other hand, mounting processing with the body can be performed by setting the feeder cart 50 on the body after the loading operation completion.

When the feeder cart 50 is set on the electronic component mounting device 1, the body can immediately make a transition to the mounting operation.

According to the example of FIGS. 1 to 10D, as hereinabove described, a feeder and a feeder control method as well as an electronic component mounting device is disclosed, each having high reliability and capable of performing control or the like capable of reliably fitting driving sprockets moving electronic components to an outlet port and sprocket holes of a supply tape with each other even if there is an acceleration pitch error between the sprocket holes at a time of newly inserting the supply tape into the feeder. Further, a component exchange time at the time of stage exchange and a component replenishing time at the time of stockout can be remarkably reduced.

In addition, tape traveling is stable due to the tape feeding with the two sprockets including the first sprocket and the second sprocket, there is no disturbance due to non-peeling, and robustness of a feeding position (position of each electronic component 4 in the outlet port 44, for example) is improved.

While the operator has started the loading operation by operating the operation panel, the electronic component mounting device 1 may be made to automatically start the loading operation.

In this example, the distance from the detection position of the tape pushing detection sensor 45 to the extraction position of the outlet port 44 by the adsorption nozzle of the mounting head 6 is already known. In a case where the electronic component 4 is stored in the headmost pocket 63, therefore, the tape pushing detection sensor 45 detects the forward end portion 60*a* of the supply tape 60, whereby the distance from the pocket 63 on the tape head (forward end portion 60*a*) up to the extraction position with the adsorption nozzle of the mounting head 6 is identified. This is because the position of each pocket 63 can be known from the position of the sprocket hole 64, i.e., the sprocket tooth 43*h* when the sprocket tooth 34*h* of the second sprocket 43 is in a state fitting with the sprocket hole 64 of the supply tape 60, and the position of the pocket 63 on the tape head which is the pocket 63 nearest from the forward end portion 60*a* of the supply tape 60 is recognized. From this, an operation of cuing in preparation for component extraction can be performed by moving (tape-feeding) this pocket 63 to the extraction position of the outlet port 44 and stopping the same.

The operation is not restricted to this, but an image of the pocket 63 on the extraction position of the outlet port 44 may be picked up with a camera provided on the mounting head 6 every time the same is fed by one pitch after stopping the pocket 63 on the tape head on the extraction position as described above for grasping whether the electronic component 4 is stored in the pocket 63 from the picked-up image by performing recognition processing. In other words, cuing may be performed by stopping the tape feeding when the pocket 63 enters a state where a component is present from a state where no component is present by image recognition processing. Thus, the electronic component 4 can be extracted by extraction with the absorption nozzle of the first mounting head 6 loaded with a new tape 60 also in a case where the electronic component 4 is not stored in the headmost pocket 63.

Alternatively, the position of the pocket 63 cued in this manner itself or the electronic component 4 in this pocket 63 on the component supply area 13 may be grasped from the picked-up image by recognition processing for positioning the adsorption nozzle of the mounting head 6 at the time of component extraction on this grasped position. Further alternatively, an image of the component extraction position may be picked up with the camera in a stage of stopping the headmost pocket 63 on the component extraction position without performing cuing according to presence/absence recognition of the component in the pocket 63 for grasping the position of the component or the pocket 63 itself by recognition processing and positioning the adsorption nozzle of the mounting head 6 on this position for the component extraction.

The separation mechanism removing the cover tape 61 on the upper portion of the pocket 63 (i.e., exposing the electronic component 4) on the component extraction portion by processing has been described in this example. However, the present disclosure is not restricted to this, but a separation mechanism or the like exposing the electronic components 4 by removing the cover tape 61 from the supply tape 60 can also be applied.

While the transportation speed for the supply tape 60 has been varied by preparing the sprocket driving motor 33 driving the third sprocket 32 and the sprocket driving motor 47 driving the first sprocket 41 and the second sprocket 43 from different motors in this example, the supply tape 60 may be fitted with the second sprocket 43 by varying the speed of the rotation of the third sprocket 32 and the second sprocket 43 by changing the acceleration ratio of the driving motor and driving transmission mechanisms (gears, belts etc.) of the sprockets by using a single identical driving motor.

While the first sprocket 41 and the second sprocket are employed for transporting the supply tape 60 and passing the same through the separation mechanism 42 and positioning/stopping the pockets 63 on the outlet port 44 for the electronic components 4 in this example, only the first sprocket 41 or the second sprocket 43 may be employed. Also at this time, the transportation speed (rotational speed of the teeth of the sprocket) of the first sprocket 41 or the second sprocket 43 for the supply tape 60 is rendered higher than the traveling speed of the supply tape 60 transported by the rotation of the third sprocket 32. Consequently, the sprocket holes 64 of the supply tape 60 can be rendered easily fittable with the first sprocket 41 or the second sprocket 43.

Also when the first sprocket 41 or the second sprocket 43 transports the supply tape 60 at a high speed due to the function of the one-way clutch 32C of the third sprocket 32, the third sprocket 32 is pulled by the supply tape 60 and rotates in a following manner. Therefore, no excess force is applied to the sprocket holes 64 of the supply tape 60, and the sprocket holes 64 can be brought into states causing no deformation.

Employment of only the first sprocket 41 means an operation of setting the separation mechanism (exposing mechanism) 42 and the outlet port 44 upstream of the first sprocket 41 and providing no second sprocket. As to the supply tape 60 transported by the third sprocket 32 in this case, a cutting blade having a blade on an upper side in the exposing mechanism 42 enters a space between the carrier tape 62 and the cover tape 61 on the forward end portion of the supply tape 60. The cutting blade so enters the space that the cover tape 61 is cut open in the direction of movement of the supply tape 60, and fits with the first sprocket 41 after exposition of the electronic components 4 is performed. Extraction of the exposed electronic components 4 is performed on the outlet port 44 upstream of the first sprocket 41.

After fitting with the first sprocket 41, the supply tape 60 is pulled and transported by the first sprocket 41 to pass through the separation mechanism 42, so that positioning/stoppage of the pockets 63 on the outlet port 44 is performed every time the same moves by the interval between the pockets 63. While the tape pushing detection sensor 45 may not be present, the same may be provided immediately in front of the separation mechanism 42 downstream of the third sprocket 32.

Employment of only the second sprocket 43 means an operation of setting the separation mechanism (exposing mechanism) 42 and the outlet port 44 in the downward direction of the second sprocket 43 and providing no sprocket at the back thereof. While the tape pushing detection sensor 45 may not be present, the same may be provided in front of the separation mechanism 42 downstream of the second sprocket 43. Therefore, the supply tape 60 passes through the separation mechanism 42 due to pushing/driving of the second sprocket 43 so that extraction of the electronic components 4 is performed, and positioning/stoppage of the pockets 63 on the outlet port is performed every time the same moves by the interval between the pockets 63. Alternatively, only the first sprocket 41 or the second sprocket 43 may be employed, for providing the tape detection sensor (may not be present) and the exposition mechanism upstream of the sprocket while providing the component outlet port downstream of the sprocket.

EXAMPLE 2

A second example of the present disclosure is now described. Also in example 2, the electronic component mounting device 1 described in FIG. 1 and the feeder cart 50 described in FIG. 2, as well as the supply tape 60 described in FIG. 3, the feeder 2 shown in FIG. 4, the third sprocket shown in FIGS. 5B to 5C and the second sprocket shown in FIGS. 6B to 6C are employed.

This unloading operation is an operation capable of a function of reversely feeding the supply tape 60 in a process already loaded on the feeder 2, extracting the same from the feeder 2 and recovering the same. Reverse feeding of the supply tape is also movable with no catches of a cover tape due to the cover tape processing system (Russell processing) of the separation mechanism 42 described in example 1, and a component exchange time in stage exchange can be remarkably reduced.

Figure 11:
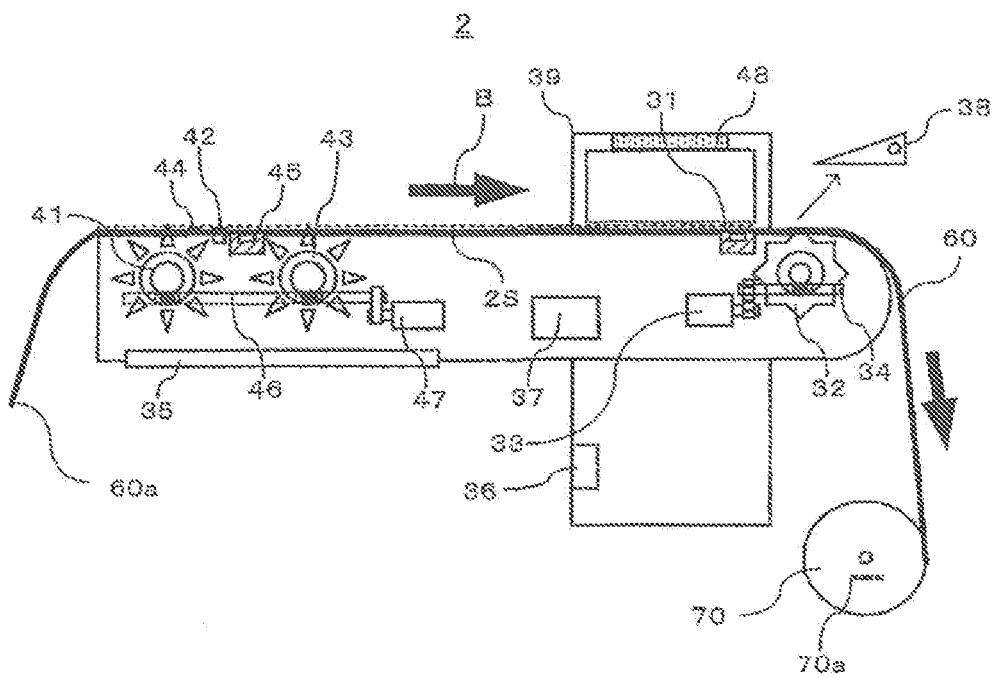
FIG. 11 is a diagram for illustrating an example of an unloading operation in the feeder according to the present disclosure.

FIG. 11 is a diagram for illustrating an example of the unloading operation in the feeder according to the present disclosure.

The operator first detaches the tape pressing plate 38, and selects a desired lane by operating the lane selection key 101 of the operation panel 48.

Thereafter the operator presses the return button 104 of the operation panel 48. For example, the operator presses the loading button 105, and also simultaneously presses the return button 104 within 1 sec. while pressing the same on the operation panel 48 of FIG. 10A. The state of this simultaneous pressing is continued for at least 1 sec., whereby the supply cassette control portion 37 of the feeder 2 starts the unloading operation.

As a constraint condition for the supply cassette control portion 37 to start the unloading operation, the tape pushing detection sensor 45 must be in a state where the supply tape is "present".

The supply cassette control portion 37 senses that the return button 104 has been pressed, and moves the supply tape 60 in the reverse direction (arrow B direction) by a prescribed quantity according to a previously set reverse feed rate. The previously set reverse feed rate is set in consideration of a quantity at which the forward end portion 60a of the supply tape 60 (tape length up to a portion immediately in front of the cutting mechanism provided in the electronic component mounting device 1) can be extracted.

The forward end portion 60a of the supply tape 60 moves in the reverse direction up to a position deviating from the second sprocket 43 (upstream direction of the second sprocket 43), and hence the operator pulls the supply tape 60 frontward (upstream direction) at this point in time, and detaches the supply tape 60 from the feeder 2.

The supply cassette control portion 37 forcibly interrupts the unloading operation of moving the supply tape 60 in the reverse direction in a case of detecting that at least any one button of the operation panel 48 has been pressed during the operation of moving the supply tape 60 in the reverse direction.

Figure 12A:
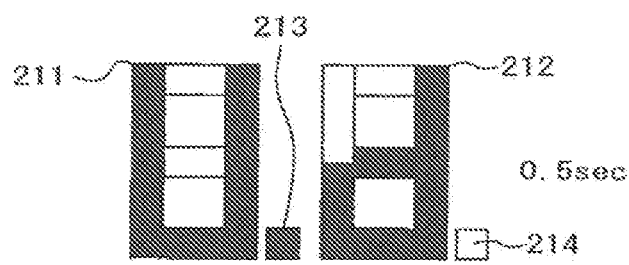
FIG. 12A is a diagram showing the example of the operation panel surface of the operation panel of the feeder according to the present disclosure.
Figure 12B:
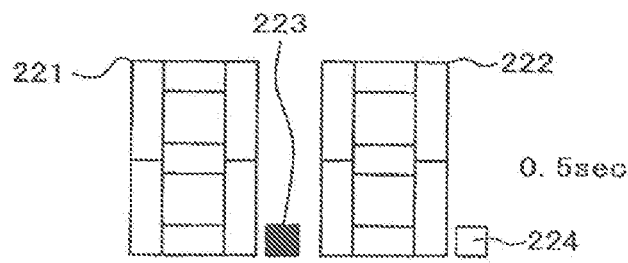
FIG. 12B is a diagram showing the example of the operation panel surface of the operation panel of the feeder according to the present disclosure.
Figure 12C:
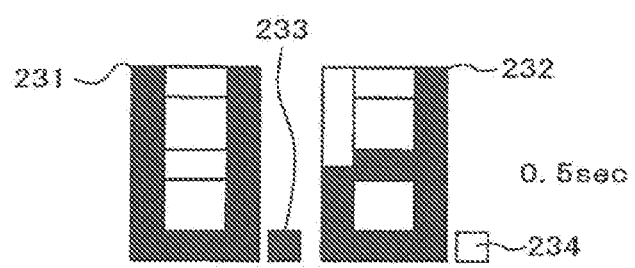
FIG. 12C is a diagram showing the example of the operation panel surface of the operation panel of the feeder according to the present disclosure.

FIGS. 12A to 12C are diagrams showing details of the digital display portion 101 of FIG. 10A.

As to the display on the digital display portion 101, 7-seg display is performed during the unloading operation. In the display, the same display continues for a prescribed time (for 0.5 sec., for example), and is successively repeated as FIG. 12A→FIG. 12B→FIG. 12C→FIG. 12A . . . .

It means that a first lane is selected when dots 213, 223 and 233 are displayed, while it means that a second lane is selected when dots 214, 224 and 234 are displayed.

In the aforementioned example 1 of the unloading operation, the cover tape has been processed by the cover tape processing system (Russell processing). However, this example is capable of unloading with any separation mechanism, so far as the same is a separation mechanism cutting a cover tape.

Further, the aforementioned example 1 has been in a double-driving system of driving three sprockets with two driving motors. However, this example may be in a triple-driving system of driving three sprockets with three driving motors.

According to the example of FIGS. 1 to 7A, 11, 12A, 12B and 12C, as hereinabove described, the supply tape 60 in a process already loaded on the feeder 2 can be swiftly and easily extracted in the upstream direction when newly inserting a supply tape into the feeder. Consequently, a component exchange time at the time of stage exchange and a component replenishing time at the time of stockout can be remarkably reduced.

While the operator has started the loading operation by operating the operation panel in each of the aforementioned examples 1 and 2, the electronic component mounting device 1 may automatically start the loading operation.

EXAMPLE 3

A third example of the present disclosure is now described. Also in example 3, the electronic component mounting device 1 described in FIG. 1 and the feeder cart 50 described in FIG. 2 as well as the supply tape 60 described in FIG. 3, the feeder 2 shown in FIG. 4, the third sprocket shown in FIGS. 5B to 5C and 7A and the second sprocket shown in FIGS. 6B to 6C and 7B are employed.

This loading operation sets a subsequent supply tape 60' in addition to the supply tape 60 of the feeder 2 already loaded with the electronic components 4 and used for component mounting, and automatically loads the subsequent supply tape 60' when the currently used supply tape 60 is exhausted.

FIGS. 14A to 14D are diagrams for illustrating an example of the loading operation in the feeder according to the present disclosure. Referring to FIGS. 14A to 14D, the supply tape 60 is already set on the feeder at present, and the electronic component mounting device 1 (see FIG. 1) continues a component mounting operation.

Figure 14A:
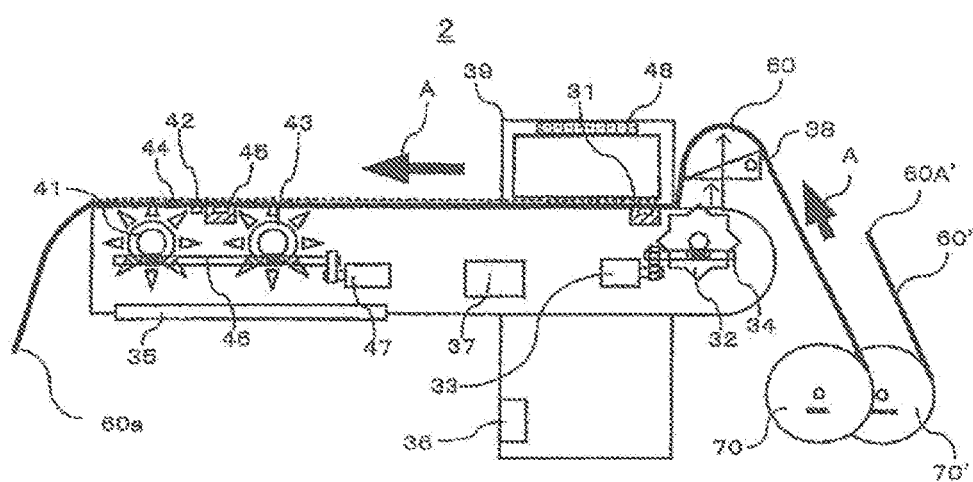
FIG. 14A is a diagram for illustrating an example of the loading operation in the feeder according to the present disclosure.
Figure 14B:
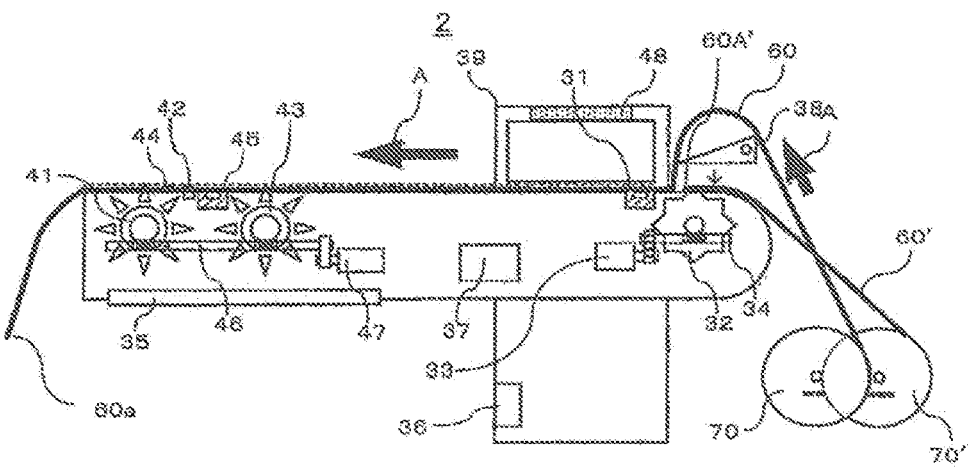
FIG. 14B is a diagram for illustrating the example of the loading operation in the feeder according to the present disclosure.
Figure 14C:
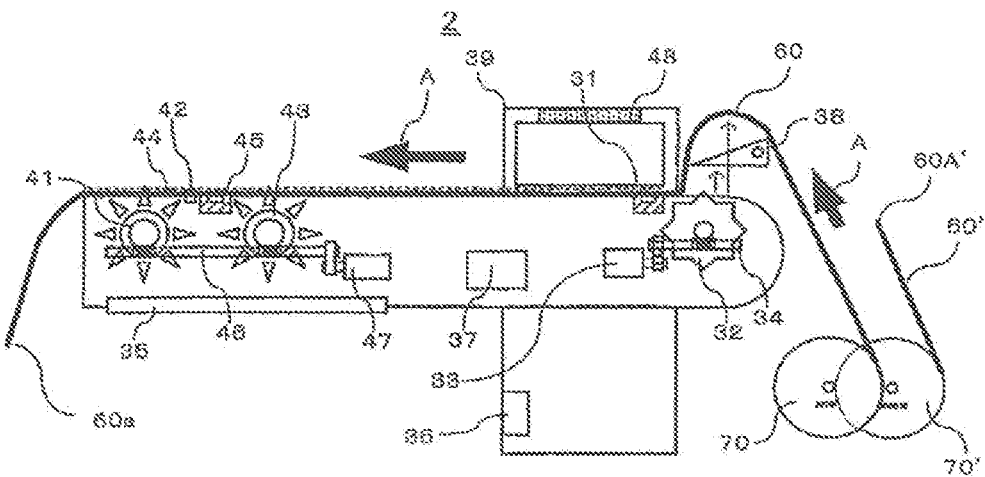
FIG. 14C is a diagram for illustrating the example of the loading operation in the feeder according to the present disclosure.
Figure 14D:
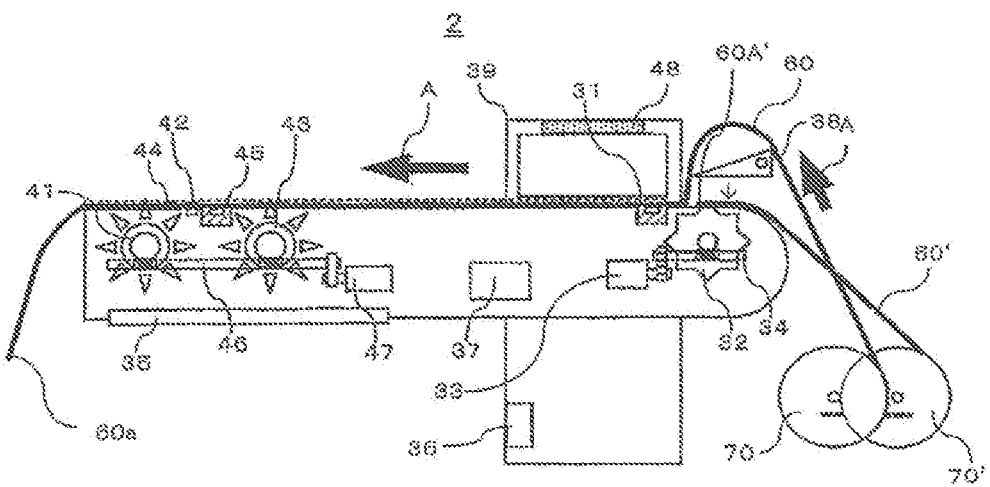
FIG. 14D is a diagram for illustrating the example of the loading operation in the feeder according to the present disclosure.

As shown in FIG. 14A, the operator first detaches the tape pressing plate 38, and lifts up an intermediate portion of the currently used supply tape 60, so that the same passes through a portion above the tape pressing plate 38. Then, the operator inserts a forward end portion 60a' of the subsequently used supply tape 60' onto the tape chute 2S, fits the tooth 32h0 of the third sprocket 32 and the sprocket hole 64 with each other, and mounts the tape pressing plate 38 from above.

The control unit 80 of the electronic component mounting device 1 determines whether or not received bar code information coincides with feeder information to be set through the received bar code information. The control unit 80 operates to continue the operation as such when the bar code information and the feeder information coincide with each other, while outputting an alarm when the bar code information and the feeder information do not coincide with each other for warning the operator and not recognizing that the preliminary supply tape 60' has been set on this feeder 2.

When a terminal end portion 60" of the supply tape 60 in use advances into the feeder 2 and passes through the tape insertion detection sensor 31, the tape insertion detection sensor 31 senses the "absence" of the supply tape 60, and transmits a signal to the control unit 80 every sensing. The control unit 80 determines that the terminal end portion 60" of the supply tape 60 has passed through the tape insertion detection sensor 31 in a case where the state of "absence" of the supply tape 60 continues for a period of a prescribed feed rate.

When a portion of the supply tape 60 in use unloaded with the electronic components 4 reaches the outlet port 44, the control unit 80 recognizes occurrence of a continuous adsorption anomaly resulting from component absence. For example, the control unit 80 recognizes that no electronic component is present (detects this by recognition of an unillustrated sensor loaded on the mounting head 6 or the component recognition camera 19) in a case where the adsorption anomaly continues three times.

The control unit 80 performs standard anomaly processing in a case where the tape insertion detection sensor 31 does not sense passage of the terminal end portion 60" but recognizes occurrence of continuous adsorption anomaly resulting from component absence.

In a case where the tape insertion detection sensor senses passage of the terminal end portion 60" and recognizes occurrence of a continuous adsorption anomaly resulting from component absence, however, the control unit 80 determines that the electronic components in the supply tape 60 in use have been used up and performs subsequent operations.

(1) Forcible Delivery Operation for Supply Tape 60 in Use (2) Automatic Loading Operation for Subsequent Supply Tape 60'

Figure 15:
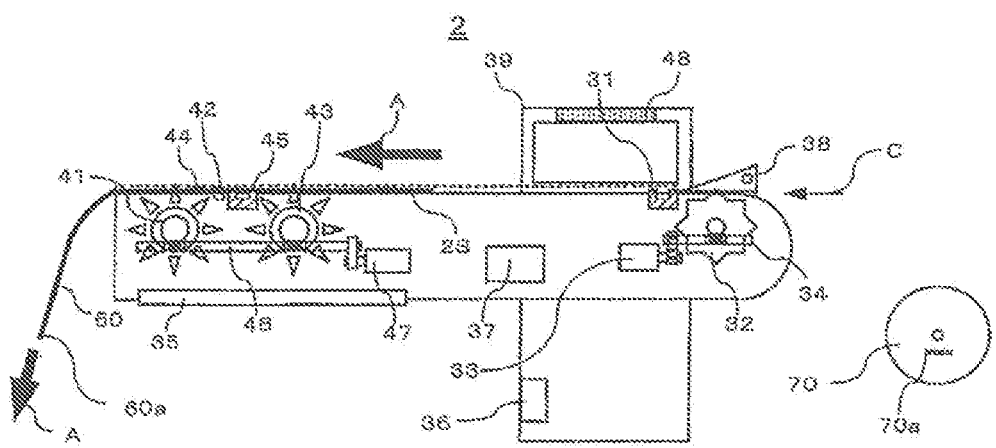
FIG. 15 is a diagram for illustrating an example of a forcible delivery operation in the feeder according to the present disclosure.

First, (1) a forcible delivery operation for the supply tape 60 in use is described according to FIG. 15. FIG. 15 is a diagram for illustrating an example of the forcible delivery operation in the feeder according to the present disclosure.

The control unit 80 first forcibly delivers the supply tape 60 in use in the forward direction in the case of determining that the electronic components of the supply tape 60 in use have been used up, as hereinabove described.

For example, the control unit 80 controls the supply cassette control portion 37 of the feeder 2, continuously rotates the sprocket driving motor 47 in the forward direction (arrow A direction) at a high speed, and discharges the supply tape 60 at a stroke. While the supply tape 60 cannot be driven when deviating from the teeth 41h of the first sprocket 41, the same is discharged in the arrow A direction due to inertia resulting from the high-speed continuous rotation and force pushed by the subsequent supply tape 60' delivered later.

Then, (2) an automatic loading operation for the subsequent supply tape 60' is started.

However, the supply cassette control portion 37 executes the preloading operation not in a case where the loading button 105 turns ON, but according to a command from the control unit 80. In other words, the supply cassette control portion 37 accepts starting of the automatic loading operation from the control unit 80, rotates the sprocket driving motor 33, checks the tape insertion detection sensor 31 after a lapse of a prescribed time, consecutively continues the loading operation as such in a case where the supply tape 60 has been sensed, and executes the loading operation. In a case where the supply tape 60 is not sensed when checking the tape insertion detection sensor 31 after the lapse of the prescribed time, the supply cassette control portion 37 does not start the loading operation, but outputs an alarm and stops the loading operation.

As to the automatic loading operation, the supply cassette control portion 37 executes the operations (see FIG. 9) of the state <i> to the state <iv> described in example 1 of this description, and thereafter makes transition to the step S1. Subsequent operations are as described with reference to FIG. 9, and hence description is omitted.

Figure 16A:
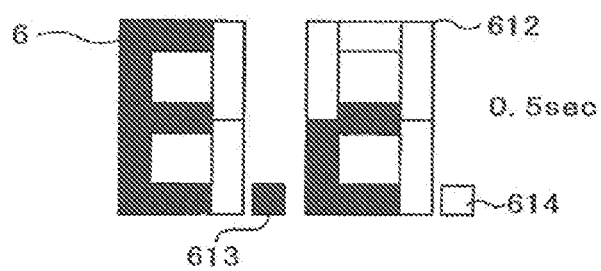
FIG. 16A is a diagram for illustrating the example of the operation panel surface of the operation panel of the feeder according to the present disclosure.
Figure 16B:
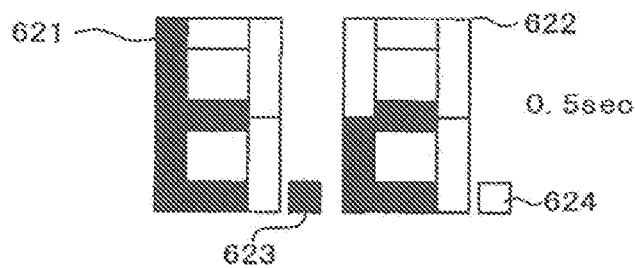
FIG. 16B is a diagram for illustrating the example of the operation panel surface of the operation panel of the feeder according to the present disclosure.
Figure 16C:
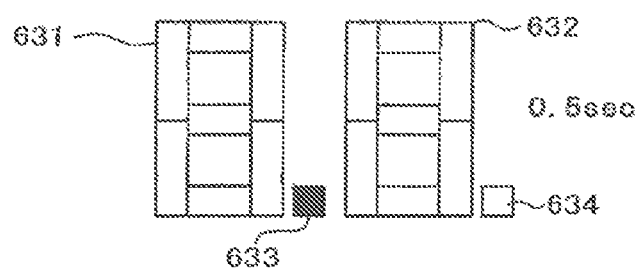
FIG. 16C is a diagram for illustrating the example of the operation panel surface of the operation panel of the feeder according to the present disclosure.

During the forcible delivery operation, "tr" indicating that the device is in the forcible delivery operation is displayed on the digital display portion 101 of the operation panel 48, as shown in FIG. 16.

When the operator presses any button of the operation panel 48 during the forcible delivery operation or during the automatic loading operation, the operation is interrupted in an intermediate stage.

Figure 13:
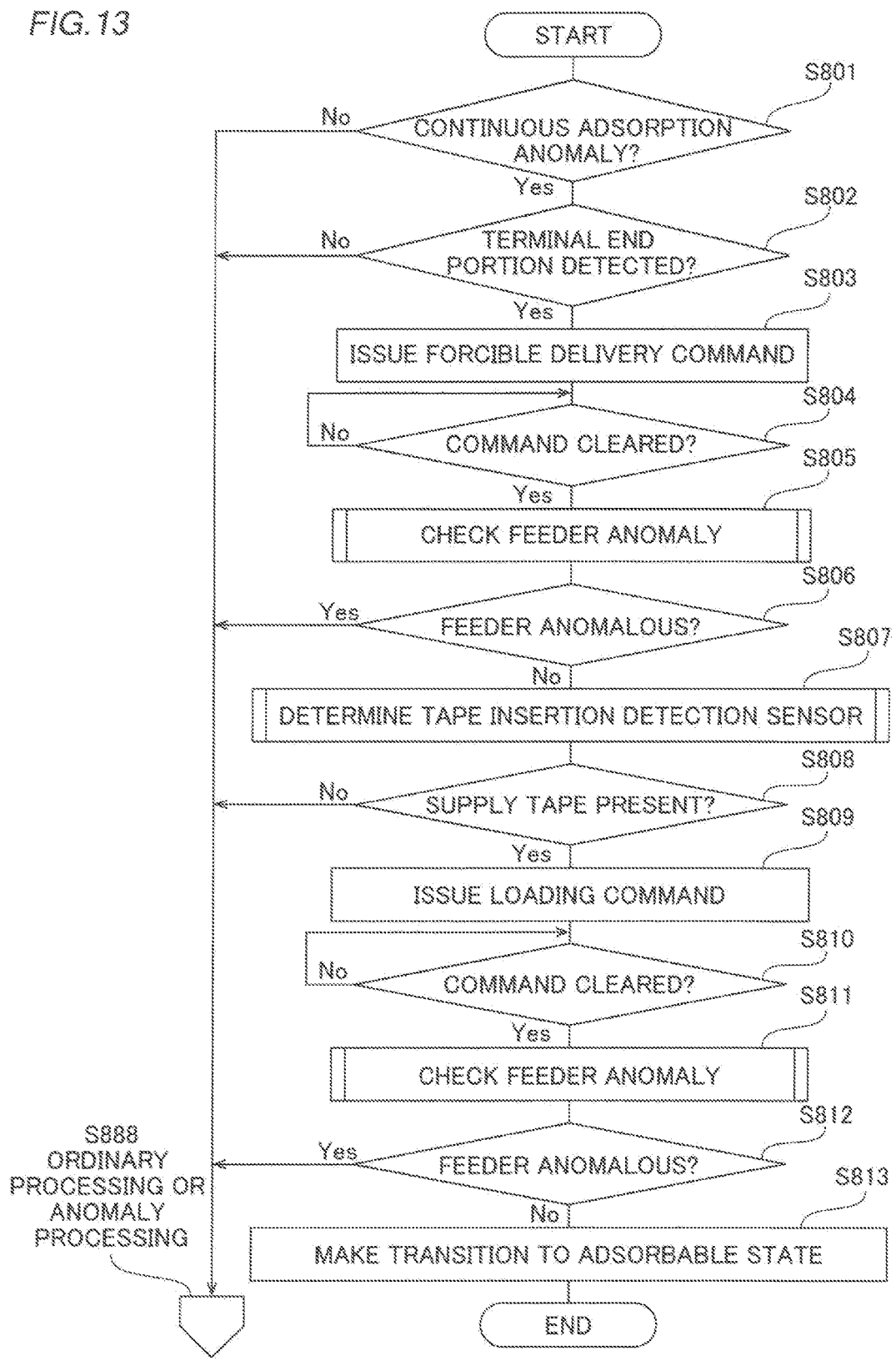
FIG. 13 is a flow chart of an example of an automatic loading operation in the electronic component mounting device according to the present disclosure.

This example is now described according to a flowchart of an example of the automatic loading operation in the electronic component mounting device according to the present disclosure in FIG. 13. The control unit 80 executes operations of FIG. 13 by controlling respective apparatuses of the body 1 as well as the supply cassette control portion 37 of the feeder 2 and other apparatuses.

At a step S801, the control unit 80 determines whether or not a continuous adsorption anomaly (components absent) has occurred. When the determination is no, the control unit 80 makes a transition to processing of a step S888, and executes ordinary processing. In a case where a continuous adsorption anomaly has occurred, the control unit 80 makes a transition to processing of a step S802.

At the step S802, the control unit 80 determines whether or not the tape insertion detection sensor 31 has sensed the terminal end portion 60". When the determination is no, the control unit 80 makes a transition to the processing of the step S888, and executes the ordinary processing. In a case of sensing the terminal end portion 60", the control unit 80 makes a transition to processing of a step S803.

At the step S803, the control unit 80 outputs a forcible delivery command ((1) forcible delivery command for the supply tape 60 in use) to the supply cassette control portion 37 of the corresponding feeder 2, and starts the forcible delivery operation.

At a step S804, the control unit 80 monitors whether or not the forcible delivery command has been cleared. The control unit 80 makes a transition to processing of a step S805 in a case where the forcible delivery command has been cleared, while the same makes a transition to the processing of the step S888 and executes the ordinary processing when the determination is no. Clearance of the forcible delivery command occurs in a case where any button of the operation panel 48 is pressed by the operator. For example, the clearance of the forcible delivery command occurs in a case where the feeder 2 is anomalous during the forcible delivery operation.

At the step S805, the control unit 80 checks whether or not the feeder 2 is anomalous.

At a step S806, the control unit 80 makes a transition to the processing of the step S888 and executes an anomaly processing in a case where there has been an anomaly, while making a transition to processing of a step S807 when the determination is no.

At the step S807, the control unit 80 confirms sensing information of the tape insertion detection sensor 31.

At a step S808, the control unit 80 makes a transition to processing of a step S809 in a case where the tape insertion detection sensor 31 senses that the supply tape is present, while the same makes a transition to the processing of the step S888 to execute the ordinary processing in a case of absence of the supply tape (no sensing).

At the step S809, the control unit 80 outputs a loading command (command) ((2) automatic loading operation for the subsequent supply tape 60') to the supply cassette control portion 37 of the corresponding feeder 2, and starts the automatic loading operation.

At a step S810, the control unit 80 monitors whether or not the automatic loading command has been cleared. The control unit 80 makes a transition to processing of a step S811 in a case where the automatic loading command has been cleared, while the same makes a transition to the processing of the step S888 to execute the ordinary processing when the determination is no. Clearance of the automatic loading command occurs in a case where any button of the operation panel 48 is pressed by the operator. For example, clearance of the automatic loading command occurs in a case where the feeder 2 is anomalous during the loading operation.

At a step S811, the control unit 80 checks whether or not the feeder 2 is anomalous.

At a step S812, the control unit 80 makes a transition to the processing of the step S888 in a case where the feeder 2 is anomalous, while making a transition to processing of a step S813 when the determination is no.

At the step S813, the control unit 80 makes a transition to an adsorbable state, and starts adsorption of the electronic components 4.

According to the aforementioned example 3, the operator may not wait to set the subsequent supply tape after the current tape is exhausted but can set the subsequent supply tape 60' at any convenient time before the supply tape is exhausted, whereby he/she can efficiently perform operations and the loading is automatically executed, and hence a component exchange time in stage exchange can be remarkably reduced.

According to example 1 to example 3, a supply tape for subsequent replenishment is not physically linked. In other words, no splicing tape for connection is necessary.

Further, the subsequent supply tape can be set on a replenishing unit at any time in a state where the supply tape in use is present.

In addition, monitoring of a replenish timing may not be severely performed, but the operator's on-duty hours can be reduced.

Further, no splicing tape as an expendable is necessary, whereby a running cost can be reduced. In other words, the material cost can be reduced.

Also as to component replenishment (setting of the supply tape) to a lane in which component exhaustion has occurred, loading has been enabled without extracting the feeder.

Further, influence by splicing transmittance (occurrence of short stoppage (device workability fluctuation) resulting from clogging) which has been affected by the skill of the operator in general is eliminated, and reliability has been improved due to the automatic loading operation.

Further, a pocket position can be automatically cued on a prescribed adsorption position also in a supply tape whose feed pitch is different by performing a cutting position for the tape forward end portion on a determined position, whereby feeding position checking after tape loading having been executed in general is unnecessary.

Further, the electronic component mounting device is ACV-correspondent, and hence the automatic loading operation can be inhibited for uncollated components. Subsequently replenished components can also be subjected to a collation operation similarly to a conventional splicing subsequent tape, and the automatic loading operation can be inhibited.

What is claimed is:

1. A feeder comprising
   a tape chute guiding movement of a supply tape,
   a sprocket A' having a tooth A' fitting with a sprocket hole of the supply tape inserted into an insertion port and moving the supply tape on the tape chute by rotation,
   a second sprocket driving motor driving the sprocket A' using a second mechanism that connects the second sprocket driving motor to the sprocket A',
   a sprocket B' provided in a downstream direction in a moving direction of the supply tape of the sprocket A', having a tooth B' fitting with the sprocket hole of the supply tape fed by the sprocket A' and moving the supply tape on the tape chute by rotation,
   an exposing mechanism for exposing an electronic component in a pocket covered by a cover tape of the supply tape fed by the sprocket B', the exposing mechanism including a cover tape guide that guides the cover tape so as not to obstruct extraction of the electronic component,
   a first sprocket driving motor driving the sprocket B' using a first mechanism that connects the first sprocket driving motor to the sprocket B', and
   a controller controlling the first sprocket driving motor and the second sprocket driving motor, wherein the sprocket A', the second sprocket driving motor, the sprocket B', the exposing mechanism, and the first sprocket driving motor are attached to a feeder body, and the controller stops the second sprocket driving motor after a forward end portion of the supply tape fits with the tooth B' of the sprocket B'.

2. The feeder according to claim 1, wherein the controller controls the second sprocket driving motor such that, when the sprocket hole on a forward end of the supply tape fed by the sprocket A' fits with the tooth B' of the sprocket B', the traveling speed of the supply tape resulting from the rotation of the sprocket B' by the first sprocket driving motor is higher than the traveling speed of the supply tape resulting from the rotation of the sprocket A' by the second sprocket driving motor.

3. The feeder according to claim 1, further comprising a one-way clutch, wherein the sprocket A' is pulled by the supply tape when the supply tape is moving faster than the traveling speed resulting from the rotation of the sprocket A' due to movement of the supply tape resulting from the rotation of the sprocket B'.

4. The feeder according to claim 1, wherein the exposing mechanism has a cutter for performing cut-open processing of the cover tape of the supply tape, and exposes the electronic component in the pocket of the supply tape by performing cut-open processing of the cover tape of the supply tape moved by the sprocket A' and the sprocket B'.

5. The feeder according to claim 1, wherein a shape of the tooth A' is a round-tooth shape or a shape having a smaller number of catches than the tooth B'.

6. The feeder according to claim 5, wherein the controller controls the first sprocket driving motor and slows down/stops the rotation of the sprocket B' when a first detection sensor provided in the downstream direction of the sprocket B' senses the forward end portion of the supply tape.

7. The feeder according to claim 6, wherein the controller performs control to move the supply tape to a position where the first detection sensor does not sense the supply tape by controlling the first sprocket driving motor to rotate the sprocket B' reversely.

8. The feeder according to claim 7, wherein the controller performs control to move the forward end portion from the position where the first detection sensor does not sense the supply tape to a position immediately before reaching a cutter by rotating the sprocket B' to move the supply tape by a prescribed quantity, a cutter being included in the exposing mechanism.

9. The feeder according to claim 8, wherein the controller performs control of the second sprocket driving motor by rotating the sprocket B' at a prescribed ultralow speed and ultralow acceleration to move the supply tape by the prescribed quantity from the position immediately before reaching the cutter of the exposing mechanism.

10. The feeder according to claim 1, further comprising a second detection sensor provided in the downstream direction of the insertion port, wherein the controller moves the supply tape in a reverse direction by the prescribed quantity according to a previously set reverse feed rate by the rotation of the sprocket B' by the first sprocket driving motor when sensing that an instruction for starting an unloading operation has been issued from an operation panel and in a case where the second detection sensor senses the presence of the supply tape.

11. The feeder according to claim 10, further comprising a plurality of lanes through which a plurality of supply tapes are parallelly fed, wherein the operation panel has a selection button for selecting any of the lanes by an operation of an operator, a return button for moving the supply tape in the reverse direction by a second prescribed quantity, an unloading button for starting the unloading operation and two display portions.

12. The feeder according to claim 11, wherein the controller interrupts the operation of moving the supply tape in the reverse direction in a case of sensing that at least any one button of the operation panel has been pressed during the operation of moving the supply tape in the reverse direction.

13. The feeder according to claim 1, further comprising a one-way clutch, wherein the sprocket A' does not reversely rotate.

14. The feeder according to claim 1, wherein the sprocket B' is provided in an upstream direction in the moving direction of the supply tape of the exposing mechanism, the feeder further comprising a sprocket C' provided in a downstream direction of the exposing mechanism, having a tooth C' fitting with the sprocket hole of the supply tape and moving the supply tape storing the electronic component exposed by the exposing mechanism on the tape chute by rotation.

* * * * *